US011315803B2

(12) United States Patent
Sri-Jayantha et al.

(10) Patent No.: US 11,315,803 B2
(45) Date of Patent: Apr. 26, 2022

(54) STRESS MITIGATION IN ORGANIC LAMINATES

(71) Applicant: International Business Machines Corporation, Armonk, NY (US)

(72) Inventors: Sri M. Sri-Jayantha, Ossining, NY (US); Soojae Park, Asan-Si (KR)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 16/872,909

(22) Filed: May 12, 2020

(65) Prior Publication Data
US 2021/0358769 A1 Nov. 18, 2021

(51) Int. Cl.
*H01L 23/498* (2006.01)
*H01L 21/48* (2006.01)
*H01L 23/00* (2006.01)

(52) U.S. Cl.
CPC .... *H01L 21/4857* (2013.01); *H01L 23/49822* (2013.01); *H01L 24/11* (2013.01); *H01L 2924/3511* (2013.01)

(58) Field of Classification Search
CPC ........... H01L 21/4857; H01L 23/49822; H01L 24/11; H01L 2924/3511
See application file for complete search history.

(56) References Cited

U.S. PATENT DOCUMENTS 7,538,432 B1    5/2009 Danovitch et al.
9,704,815 B2    7/2017 Choi et al.
(Continued)

FOREIGN PATENT DOCUMENTS

CN    202918583 U    5/2013
JP    2001181358 A    7/2001
JP    5309311         10/2013

OTHER PUBLICATIONS

Kacker, K., Lo, G. C., & Sitaraman, S. K. (2008), Low-K dielectric compatible wafer-level compliant chip-to-substrate interconnects. IEEE Transactions on Advanced Packaging, 31 (1), 22-32.
(Continued)

*Primary Examiner* — Nicholas J Tobergte
(74) *Attorney, Agent, or Firm* — Daniel P. Morris; Erik Johnson; Lou Percello, Attorney, PLLC

(57) ABSTRACT

The substrate includes one or more bottom circuit (BC) layers disposed one upon another and one or more front circuit (FC) layers disposed one upon another. The FC layers are disposed on the BC layers. In some embodiments, there are one or more core layers disposed between the FC and BC layers.

One or more soft zones are located within and penetrate through one or more of the FC layers. Each soft zone has a soft zone volume which is made of one or more component volumes located in each of one or more of the FC layers. Each soft zone component volume has a soft zone cross sectional area. The soft zone cross sectional areas are located inside a chip boundary projection. The chip boundary projection is a vertical projection of one or more sides of a semiconductor chip through the FC layers. The soft zone volume contains a soft zone material with a Young's modulus that is less than 100 GigaPascals (GPa). Alternative embodiments are presented with outside soft zones outside the chip boundary projection.

22 Claims, 17 Drawing Sheets

(56) References Cited

U.S. PATENT DOCUMENTS

2005/0006141 A1   1/2005   Stillabower
2019/0057930 A1*  2/2019   Bae .................. H01L 23/49503
2020/0358087 A1* 11/2020   Horibe ................. H01M 4/134

OTHER PUBLICATIONS

Anonymously, (Mar. 2008). Method for a low CTE core for organic substrates. IPCOM000022334D.
Venky Sundaram, et al., "Recent Advances in Low CTE and High Density System-on-a-Package (SOP) Substrate with Thin Film Component Integration", Packaging Research Center, Georgia Institute of Technology, Atlanta, GA; Indian Institute of Science, Bangalore, India; Starfire Systems, Malta, NY.
Zihan Wu, et al. "Modeling, Design and Fabrication of Ultra-thin and Low CTE Organic Interposers at 40 um I/O Pitch", 3D Systems Packaging Research Center; Mitsubishi Gas Chemical.

* cited by examiner

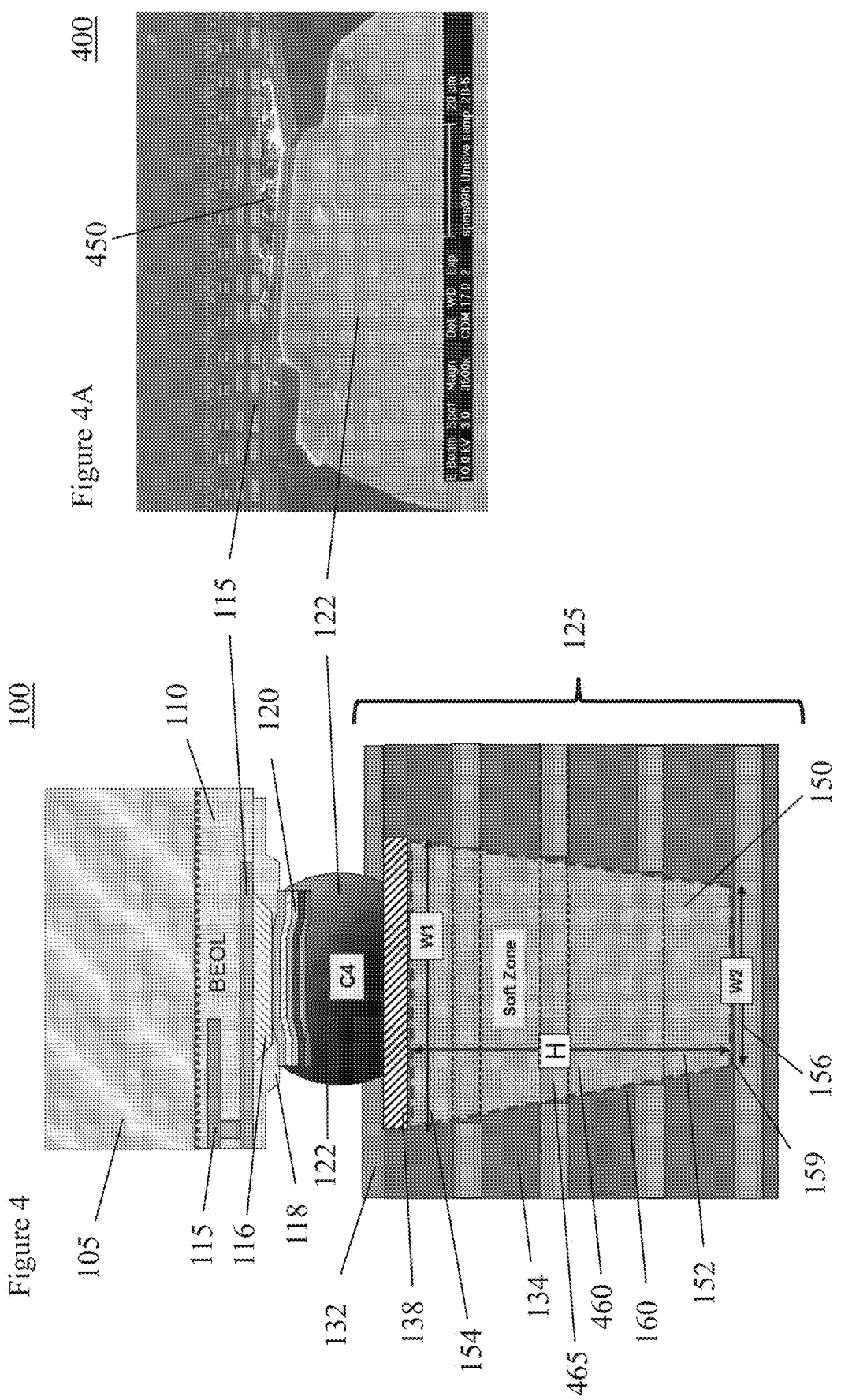

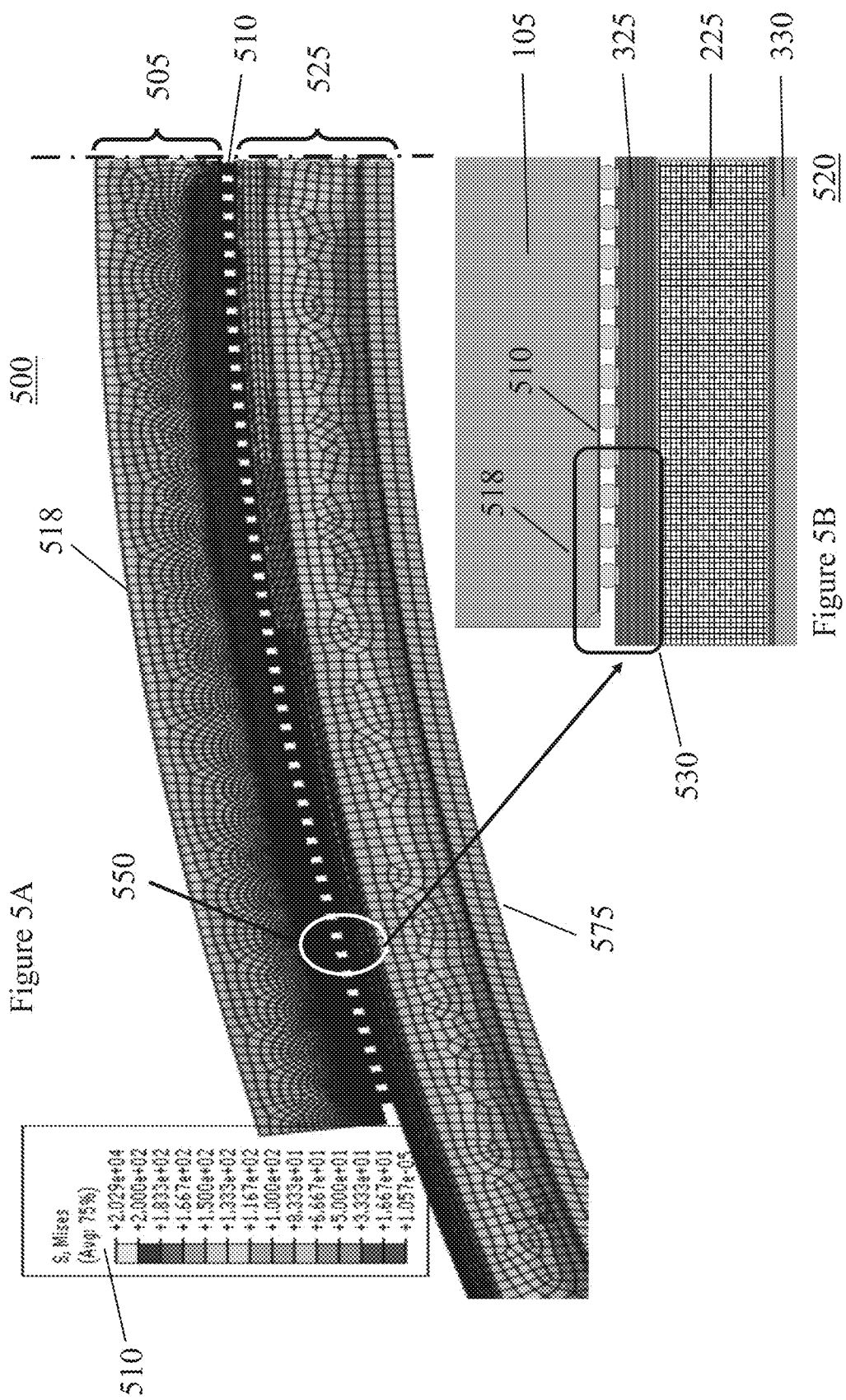

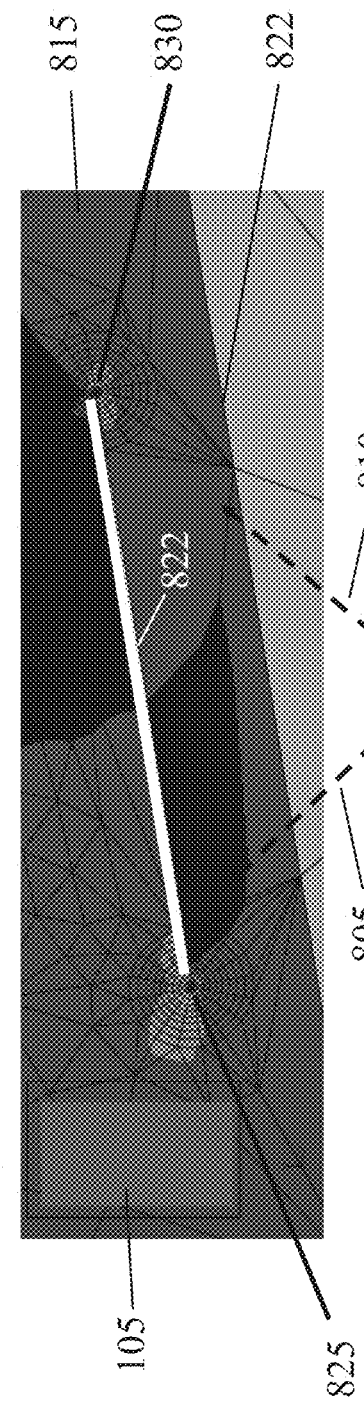
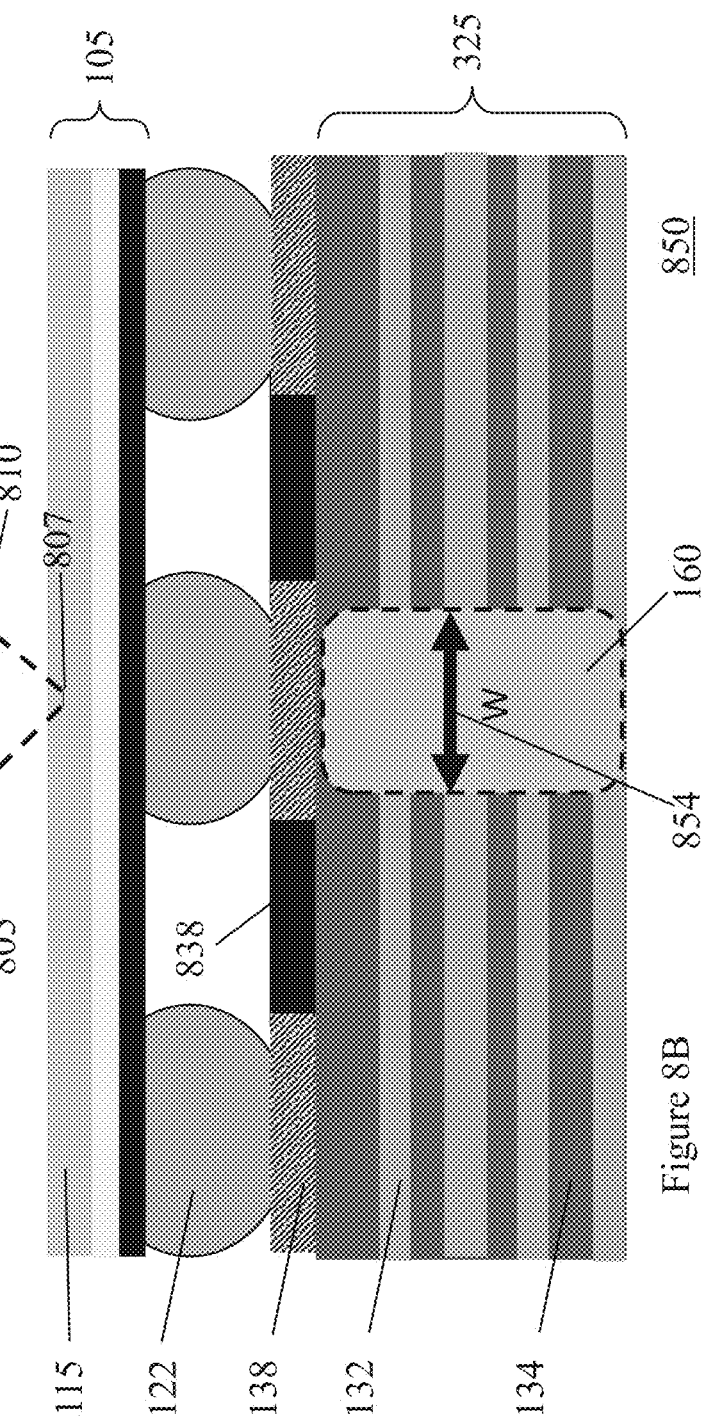
Figure 8A
Figure 8B

STRESS MITIGATION IN ORGANIC LAMINATES

BACKGROUND

The present invention relates to minimizing stress, strain, and warping in the organic substrates. More specifically, the invention relates to reducing stress in organic substrates to prevent dielectric failure of internal circuitry in attached semiconductor chips, underfill attachment/delamination, and Multi-Terminal Laminated Integrated Circuit (MTLIC) connection.

Organic substrates typically have a core about 400-800 micrometers (μm) thick made of fiber reinforced organic or resin material. In some instances, to reduce cost, the core is eliminated in the substrate, e.g., in coreless substrates, so the "core" becomes a hypothetical reference plane at the center of the substrate.

Metal and/or metal interconnection layers are progressively built layer by layer upon one another on the top and bottom of the core by a series of process steps. Each of the substrate circuit interconnection layers or power/ground planes is separated by a sheet of photosensitive resin. The steps that build the layers involve electroless-plating, electroplating, etching, polishing, placement of dielectric resin, high temperature pressing of resin, etc. Laser drilling of the resin and electroplating processes are used to fabricate vias that help connect various layers. Multi-stack vias are used to link metal connections in different layers of the substrate.

The buildup layers between the chip/die and the core are referred to as "FC" layers (Front Circuit) and the layers on the side of the core opposite the chip are referred to as "BC" (Bottom Circuit) layers. Since each metal layer is designed to optimize electrical performance, the mechanical characteristics of each layer are not precisely controlled. The FC layers generally have a dense interconnect structure made of metal lines, typically etched from a layer of copper deposited by means of a plating process. The BC layers, on the other hand, tend to have a continuous sheet of metal (e.g. copper) with distributed holes for vias to pass through. Such configurations inevitably lead to a substrate with asymmetric thermomechanical properties including stress, strain, and warp.

Because the layers are built of different materials each layer responds differently to thermal and/or mechanical cycles the substrate undergoes. Temperature and/or mechanical cycling during stages of manufacture and assembly produce stresses, strains, and warping in the substrate, layers of the substrate, attached components, and connections. Particularly, these effects occur when the substrate is heated to reflow solder connections to attach semiconductor chips (chip) to the substrate, e.g. during a flip-chip assembly process. During these cycles one or more of the layers of the substrate can delaminate. As a result, the yield of operable substrates is reduced and operational failures increase.

There is a need to improve yields of organic substrates by minimizing failures related to thermal and mechanical cycling of organic substrates and structures attached to these organic substrates. especially during flip-chip assembly.

SUMMARY

Embodiments of the present invention are an organic substrate and/or a semiconductor package that includes an organic substrate electrically connected to one or more devices, e.g. semiconductor chips/dies, Multi-Terminal Laminated Integrated Circuits (MTLICs), components, etc.

The substrate includes one or more bottom circuit (BC) layers disposed one upon another and one or more front circuit (FC) layers disposed one upon another. The FC layers are disposed on the BC layers. In some embodiments, there are one or more core layers disposed between the FC and BC layers.

One or more soft zones are located within and penetrate through one or more of the FC layers. Each soft zone has a soft zone volume which is made of one or more component volumes located in each of one or more of the layers. Each soft zone component volume has a soft zone cross sectional area. The soft zone cross sectional areas are located inside a chip boundary projection. The chip boundary projection is a vertical projection of one or more sides of a semiconductor chip (or other device) through the FC layers. The soft zone volume contains a soft zone material with a Young's modulus that is not above 100 GigaPascals (GPa).

In alternative embodiments, there are one or more outside soft zones. The outside soft zones each have an outside soft zone volume. As before, each outside soft zone volume is located within and penetrates through one or more of the PC layers. The outside soft zone volumes have an outside soft zone cross sectional area and the outside soft zone volume contains the soft zone material as well. The outside soft zone volumes are located outside the chip boundary projection.

Methods of making the soft zones and alternative connection configurations are disclosed.

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

FIG. 4 is a cross section elevation view of a cut away region of an organic substrate, shown in FIG. 1, showing the location of a dielectric failure in BEOL internal circuitry of the connected die/chip.

FIG. 4A is a micrograph image of a dielectric failure, e.g. circuit fracture, in the BEOL internal circuitry of the connected die/chip.

FIG. 5A is a result of a finite element analysis (FEA) of a model of internal stress and warpage undergone by the die and FC layers of a substrate that cause dielectric failures.

FIG. 5B is a block diagram showing a die and substrate with the region analyzed by the finite element analysis shown in FIG. 5A.

FIG. 8A shows a magnified finite element analysis (FEA) illustration showing a fracture line between two high stress locations in the internal chip interconnection layers of the chip/die.

FIG. 8B is a cross-sectional elevation view of the FC layers of a substrate, C4 connections, soft zone, and internal chip interconnection layers of the chip/die subject to fracture, e.g. a dielectric failure in the BEOL internal circuitry of the connected die/chip.

DETAILED DESCRIPTION

Figure 1:
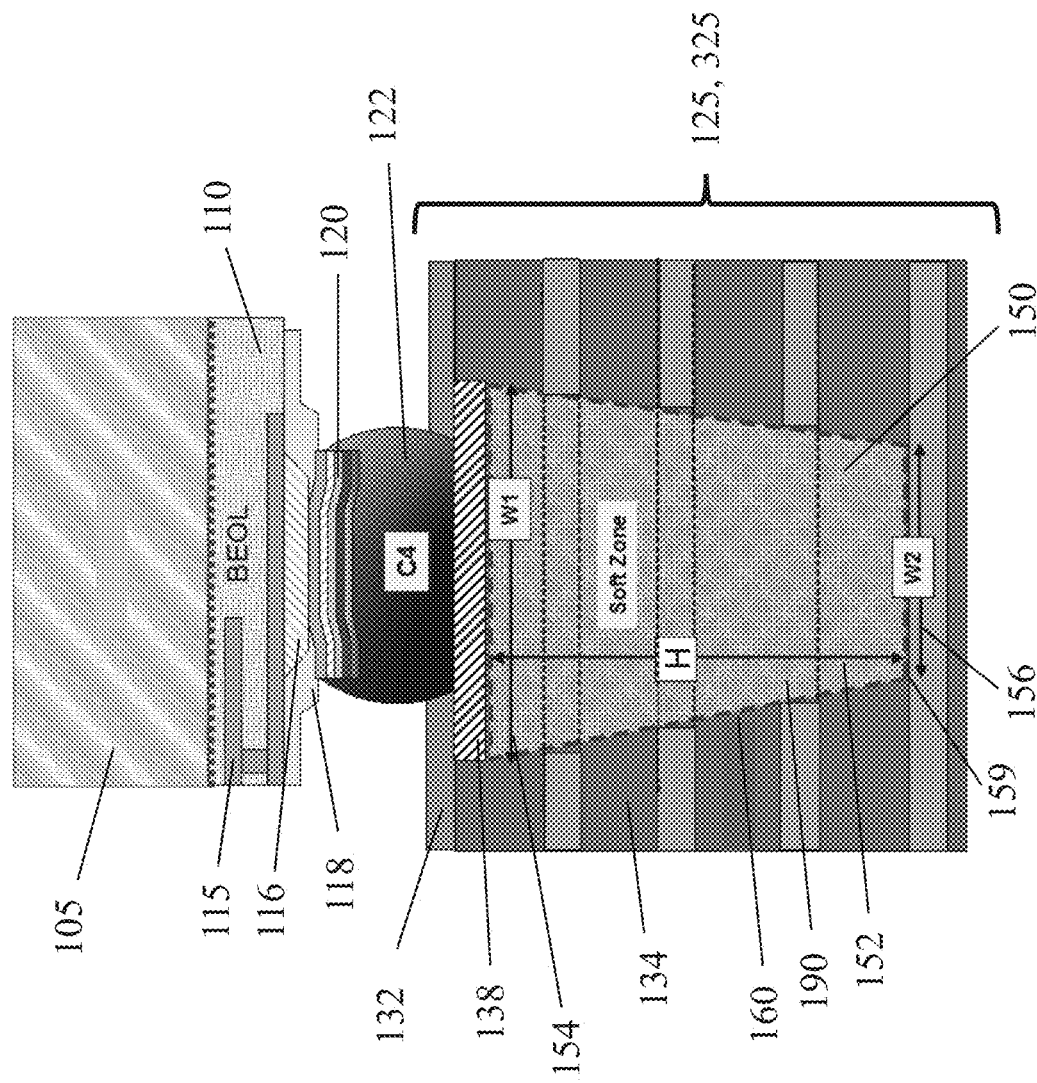
FIG. 1 is a cross section elevation view of a cut away region of an organic substrate electrically and mechanically connected to a die/chip through an electrical connection, e.g. a C4 contact.

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures may not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

In some embodiments, the present invention has one or more layers of the organic substrate with no metal (e.g, copper circuitry) placed at one or more locations, i.e: "soft zones", of the substrate layers. Metal/copper circuitry and other less elastic material are eliminated from or kept out of the soft zones. Keeping less elastic/flexible material out of the soft zones of the substrate reduces substrate stress during temperature and/or mechanical cycling, for example as experienced during flip-chip assembly.

In some embodiments, structures like copper interconnects, voltage planes, and/or ground planes are prohibited from being in the soft zones of one or more layers of the substrate. Non-limiting examples of materials and/or structures excluded from the soft zones include: materials with a Young's modulus above 100 GigaPascals (GPa), or even above 50 GPa, like copper, aluminum, nickel, tungsten, gold, and their alloys.

In some embodiments, the soft zones are embedded with a low modulus material. Low modulus material has a Young's modulus below 50 GPa. in some embodiments, these low modulus materials have a Young's modulus below 25 GPa, or even below 10 GPa. For example, a low modulus resin is embedded in some or all the volume of one or more of the soft zones. In other embodiments, the low modulus material is embedded in volumes of the substrate that are in the vicinity but outside the soft zone, as well. Non-limiting examples of low modulus material include: resin, epoxy, epoxy resin, glass epoxy, and FR-4.

In some embodiments soft zones are created by embedding the low modulus material in one or more of the high stress regions of the organic substrate layers. Examples of high stress regions include volumes of layers within the vertical projection of one or more of the edges and/or corners (chip boundary projections) of the semiconductor chip/die(s) (or other devices) attached to the substrate. Embedding the low modulus material within, at, and/or outside the chip boundary projections in one or more layers of the substrate reduces stress in the underfill region of the chip/substrate combination/structure. Other examples of high stress regions where stress is reduced by the present invention include volumes of layers of the substrate under connections to chips and regions that experience high magnitudes of temperature cycling.

FIG. 1 is a cross section elevation view of a cut away region 100 of an organic substrate 125 electrically and mechanically connected to a die/chip 105 through one of one or more electrical connections 122, e.g. a C4 contact 122.

The chip 105 includes a one or more layers of internal chip interconnections 115, e.g. typical of those interconnections made for chip circuitry in "back-end-of-the-line" (BEOL) stages of chip fabrication. A conductive, e.g. metallic, pad 116 provides an electrical connection from one or more of the internal chip interconnections/lines (chip interconnections) 115 through an electrically insulating casing 118 which encases the circuitry within the chip/die 105.

The pad 116 enables electrical contact from the internal chip interconnections 115 to external circuitry, e.g. through a C4 connection 122. Connection layers 120 are metalization layers, e.g. layers of nickel, that are known structures for improving the electrical connection to the C4 contact 122.

The substrate 125 has one or more layers of different materials. For example, substrate interconnections 132 are within one or more horizontal layers 132 in the upper layers 325 (e.g. Front Circuit, FC, layers) of the substrate 125. Some of the substrate interconnections are connected by vertical vias (not shown) that pass through one or more of the substrate layers (132, 134). Between the substrate interconnection layers 132 are resin layers, typically 134. The resin layers 134 are made from electrically insulating, low k material like fiber reinforced organic or other resin material. In some embodiments, the substrate interconnection layers 132 are partially made of copper.

In some embodiments, resin layers 134 and substrate interconnection layers 132 alternate, one on top of another, within the substrate 125. Substrate interconnections layers 132 can include interconnection lines or conductive (e.g. copper) sheets or planes (like power or a ground planes) layered within the resin layers 134 as required by the circuit design of the substrate 125. The substrate interconnection layers 132 can include one or more internal substrate connections/lines, vias, and/or components within the substrate 125.

A substrate pad 138 can be included as part of a substrate conductive layer and/or line 132 that is within one or more layers of the organic substrate 125. Also, the substrate pad 138 can be a separate electrically connection connected to a substrate conductive layer and/or line 132. The substrate pad 138 makes electrical connection to circuitry external to the substrate 125, e.g. the C4 contact 122 on the chip/die 105.

Note that initially, i.e, before reflow, the solder ball (C4) connection 122 can be physically and electrically connected either to the chip pad 116 or the substrate pad 138. During reflow, the chip/die 105 and the substrate 125 are brought together so that the pad 116, C4 contact 122, and substrate pad 138 are in physical proximity. At that time and by known techniques, the C4 contact 122 melts (is reflowed) to physically and electrically connect the pad 116, C4 contact 122, and substrate pad 138.

In some embodiments, the temperature of the assembly increases above a reflow temperature of the material (e.g., in the C4 contact 122) so that the material, e.g. solder, flows to electrically connect the chip pad 116, C4 contact 122, and substrate pad 138 after the solder cools. This reflow temperature cycle causes thermal stresses, strains, and warping in the chip/die 105, connection 122, and substrate 125 layers, e.g. 132/134. Other temperature and mechanical cycles are experienced during manufacture and operation. Some of the larger stresses/strains in the substrate 125 occur in regions under the C4 contacts 122.

Embodiments of the invention place 3-dimensional "soft zones" 160 within the layered structure of the substrate 125, typically within one or more of the upper layers 325 of the substrate 125. In some embodiments, the soft zones 160 of made of a soft material 150 that is electrically insulating, e.g. a low k material, and that has more mechanical flexibility/elasticity than other layers of the substrate 125, e.g. layers 132, that contain less flexible/elastic material. Non-limiting examples of soft material 150 include, but are not limited to, low modulus material 150 with a Young's modulus below 50 GPa, more preferably below 25 GPa, or even more preferably below 10 GPa. As stated above, non-limiting examples of low modulus material 150 include: resin, epoxy, epoxy resin, glass epoxy, and FR-4.

The low modulus material is embedded in soft zone volumes 160 at one or more locations 190 in the upper layers 325 of the substrate 125. No material with a Young's modulus greater than 100 GPa. is permitted in the soft zone 160. In some embodiments, material with a Young's modulus greater than 50 GPa, or even greater than 10 GPa is excluded.

In some embodiments, soft zones 160 are placed in regions/locations 190 within upper layers 325 of the substrate 125 that experience high stresses/strain/warping due to mechanical (drilling, ablating, polishing, compressing, etc.) and thermal (e.g. temperature cycling like solder reflow) processes during assembly and operation of electronic packages. (Electronic packages are combinations of the substrate 125 and attached components like chips 105, active and passive components, etc.)

Non-limiting example regions for soft zone 160 placement include regions (soft zone 160 locations 190) within one or more layers (132, 134) and under/within the chip boundary projections (the projection of the chip edges and/or corners of the chip/die 105 through the substrate 125 layers). In some embodiments, soft zone locations 190 include regions in upper layers 325 of the substrate 125 within all or part of the areas within the chip boundary projections. However, as described in more detail below, soft zone locations 190 may not exist in some of the FC layers 325 of the substrate 125, may not fill the entire area defined by the chip boundary projection in one or more FC layers 325, and/or may extend outside the chip boundary projections in some of the FC layers 325. The size and location 190 of the soft zones 160 depends on the magnitude, type, and probable location of failure caused by thermal and mechanical cycling encountered by the chip/die 105 and substrate 125 as a result of reflow, machining, polishing, laser ablation, operational temperature swings, etc.

In some embodiments, no material other than the soft material 150 is within the soft zone 160. The soft zone 160 is a volume in the substrate 125 at a location 190 within the substrate 125 where non-flexible materials, e.g. with higher values of Young's modulus, are excluded. Non-flexible material like metal, e.g. metal contacts, planes, lines, like interconnections 138 are not permitted in the soft zone 160 because these material will not provide the flexibility/elasticity needed to reduce the strain/stress/warping caused by the mechanical and thermal cycles experienced by the substrate 125.

While in some embodiments metal, e.g. interconnections 138 and metal layers/planes 138, are not in the soft zone 160, non-flexible materials, like metal, are permitted outside the soft zone 160 in some embodiments. For example, the substrate pad 138 lies on top of soft zone 160.

The soft zones 160 have a depth, H 152, that penetrates one or more layers (132, 134) of the substrate 125. The depth 152 of the soft zone 160 can adsorb compressive (and other) forces imposed on regions of the substrate 125. The soft zones 160 have one or more widths (e.g. W1 154 and W2 156). The widths (154, 156) can vary along the vertical dimension of the soft zone 160 but in some embodiments the width (154, 156) will not vary. For example, the width (154, 156) of the soft zone 160 in each layer (132, 134) can be different.

In some embodiments, the depth 152 of the soft zone 160 is determine by the amount of stress, e.g. caused by vertical forces and/or bending moments, the substrate 125 will experience at the location of the soft zone 160. In some embodiments, the depth 152 of the soft zone 160 varies between 40 and 1000 microns.

In some embodiments, the width (154, 156) of the soft zone 160 is determined by the amount of expansion (e.g. in the horizontal, X-Y direction) that the substrate 125 will experience at the location of the soft zone 160. This expansion, e.g. thermal expansion, can be caused by thermal cycling. Thermal expansion is influenced by the coefficient of thermal expansion (CTE) of the materials surrounding the soft zone 160, the magnitude of thermal cycling experienced, and/or the amount of bending and/or warp experienced. by the substrate 125 (among other things) in the location of the soft zone 160. In some embodiments, the width of the soft zone 160 varies depending on design criterion.

The amount of thermal expansion experienced by locations within the substrate 125 is also affected by the distance the location within in the substrate 125 is away from the heat source causing the temperature cycling. For example, while large temperature cycles are experienced at the location of the substrate pad 138 during reflow, the temperature cycles cause by the reflow will have a lower magnitude at locations further from the heat application, e.g. at lower layers 132 in the substrate 125. With other variables constant, the locations with lower magnitudes of temperature change with experience lower stresses, strains, warping, expansions, etc.

The design of the soft zone 160 volume involves trade-offs. The soft zone 160 should be large enough to minimize stress, strains, and warping in the substrate 125. However, if the soft zone 160 is too large, interconnections and their routing in the substrate can be more difficult because conductive material is excluded from the larger volume soft zones 160.

To limit the encroachment of conductive material in a soft zone 160, the soft zone 160 can be shaped to have more volume where more thermal expansion is experienced and less volume where less thermal expansion is experienced.

In some embodiments, the widths (154, 156) of the soft zone 160 varies along the vertical dimension of the soft zone 160 because different amounts of expansion (and/or contraction) are experienced at different layers (132, 134) of the substrate 125. For example, during the solder reflow, the horizontal expansion/contraction at the top layers (near to the C4 contact 122 where heat is applied) of the substrate 125 is greater than that at the lower layers of the substrate 125, i.e., the temperature distribution through the substrate layers (132, 134) is not uniform. The temperature cycle at the point of reflow, e.g. at the solder ball C4 122, will be larger than at the bottom 159 of the soft zone 160. In addition, the materials (or combination of materials) in the region of the C4 122 and substrate pad 138 might be stiffer and/or have a larger CTE than the materials elsewhere in the soft zone 160. Accordingly, the width, W1 154, can be made larger at the top of the soft zone 160 than at the bottom 159 of the soft zone 160. The wider 154 part of the soft zone 160 enables a larger volume of flexible material within layers 132/134 at the top of the soft zone 160 to absorb the greater expansion/contraction and commensurate stress/strain at the top area (near the C4 contact 122). In contrast, less volume of flexible material 150 (and smaller width W2 156) is needed at the bottom 159 of the soft zone 160 because the temperature variations are less and produce a lower amount of stress, strain, and warp that has to be absorbed at the bottom location 159. As a result, some embodiments of soft zones 160 have a shape like truncated cone or pyramid with the larger volume part of the soft zone 160 being closest to the region in the substrate 125 with the highest thermal expansion, stress, strain, and warpage.

Similar considerations factor into the design of the depth, H 152, of the soft zone 160. If the layers (132, 134) below the bottom 159 of the soft zone 160 experience stress, stain, and warpage within a design tolerance, even during the most extreme temperature cycles, e.g. reflow, there is no reason to extend the soft zone 160 depth 152 below that determined bottom 159 point.

Figure 2:
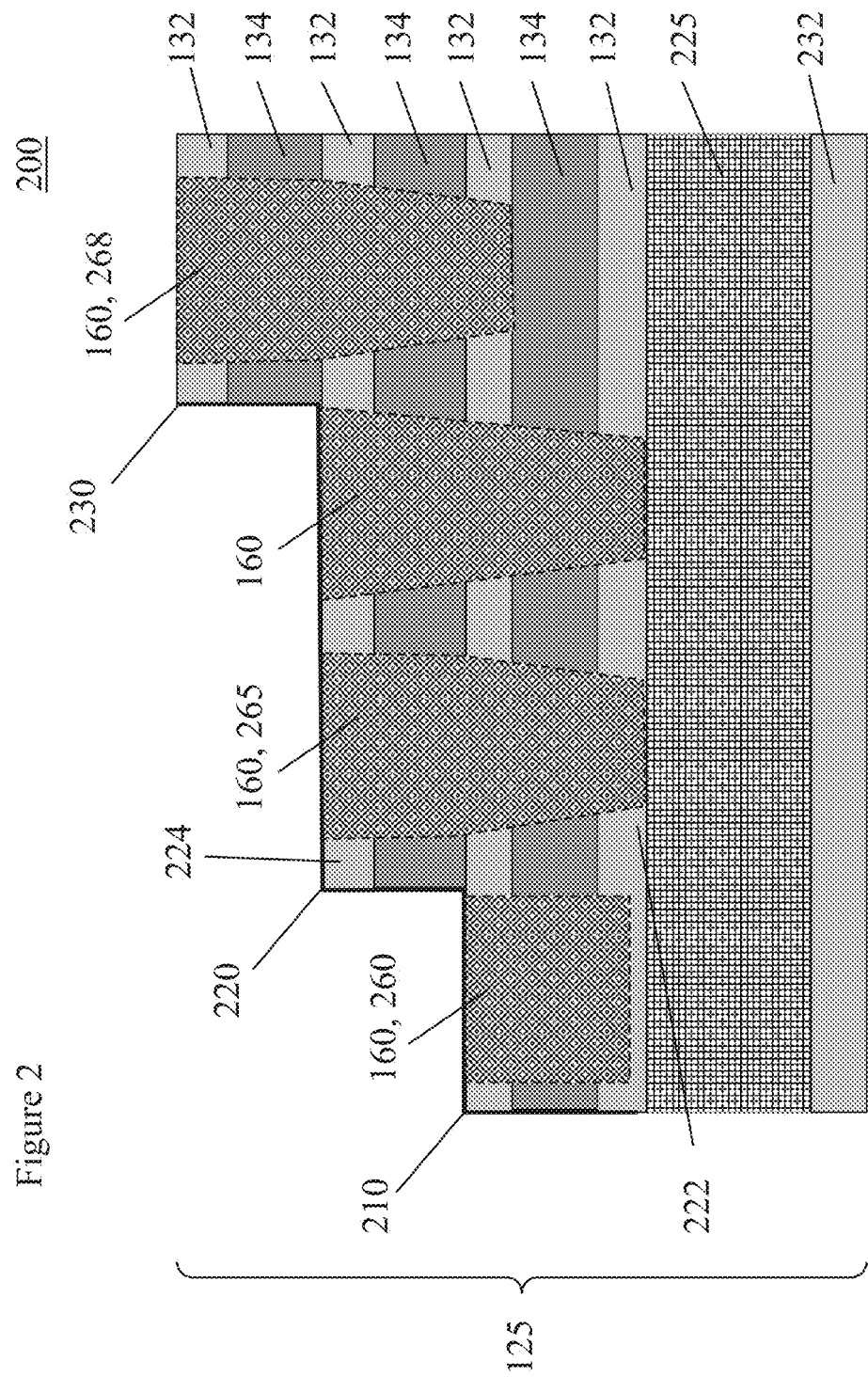
FIG. 2 is a block diagram of one or more substrates each with different thicknesses and each substrate having one or more soft zones.

FIG. 2 is a block diagram 200 of one or more substrates (210, 220, 230, 125) each with different thicknesses and with each substrate (210, 220, 230, 125) having one or more soft zones 160. The core 225 of the substrates (210, 220, 230, 125) and a BC layer 232 below the core 225 is shown.

Substrate 210 is a thin substrate 210 with the fewest number of layers. Substrate 220 is a medium thick substrate 220 with more layers (132, 134) and substrate 230 is a thick substrate 230 with the greatest number of layers (132, 134).

The thin substrate 210 has a soft zone (160, 260) that does not vary in width (154, 156) and has depth 152 that extends from the surface of the thin substrate 210 to the top of the core 225, e.g. through all the Front Circuit (FC) layers, those layers between the core 225 and the chip/die 105. Because this substrate 210 is thin, the thermal expansion effects caused by temperature changes at the thin substrate 210 surface are experience with a high magnitude in all the layers (132, 134) from the surface of the substrate 210 to the core 225. Therefore, a higher volume of low modulus material 150, hence a larger width (154, 156) is needed for the soft zone 160 for all the layers (132, 134) in the thin substrate 210. The soft zone 160 width does not decrease at the bottom 159 of the soft zone 160 in this example embodiment.

The medium thick substrate 220 has more layers (132, 134) so in this non-limiting example the thermal expansion effects at the lower levels 222 of the FC layers have magnitudes of thermal expansion less than those experienced at the higher levels 224 of the medium thick substrate 220. In this example, while the soft zone (160, 265) depth 152 still extends to the top of the core 225, the soft zone (160, 265) has a shape like truncated cone or pyramid. The smaller width 156 of this soft zone (160, 265) at the lower levels 222 enables a larger region in these lower levels 222 of the substrate 220 to route interconnections 132.

The thick substrate 230 has a large enough number of layers (132, 134) so that the layers (132, 134) in the lower levels 222 of the FC layers do not experience thermal expansion/contraction magnitudes large enough to require a soft zone (160, 268). As such, the soft zone (160, 268) in this embodiment does not extend into the lower layers 222 of the FC layers and interconnection routing is enabled anywhere in these lower layers 222. In this embodiment, the soft zone (160, 268) also has a shape like truncated cone or pyramid.

Figure 3:
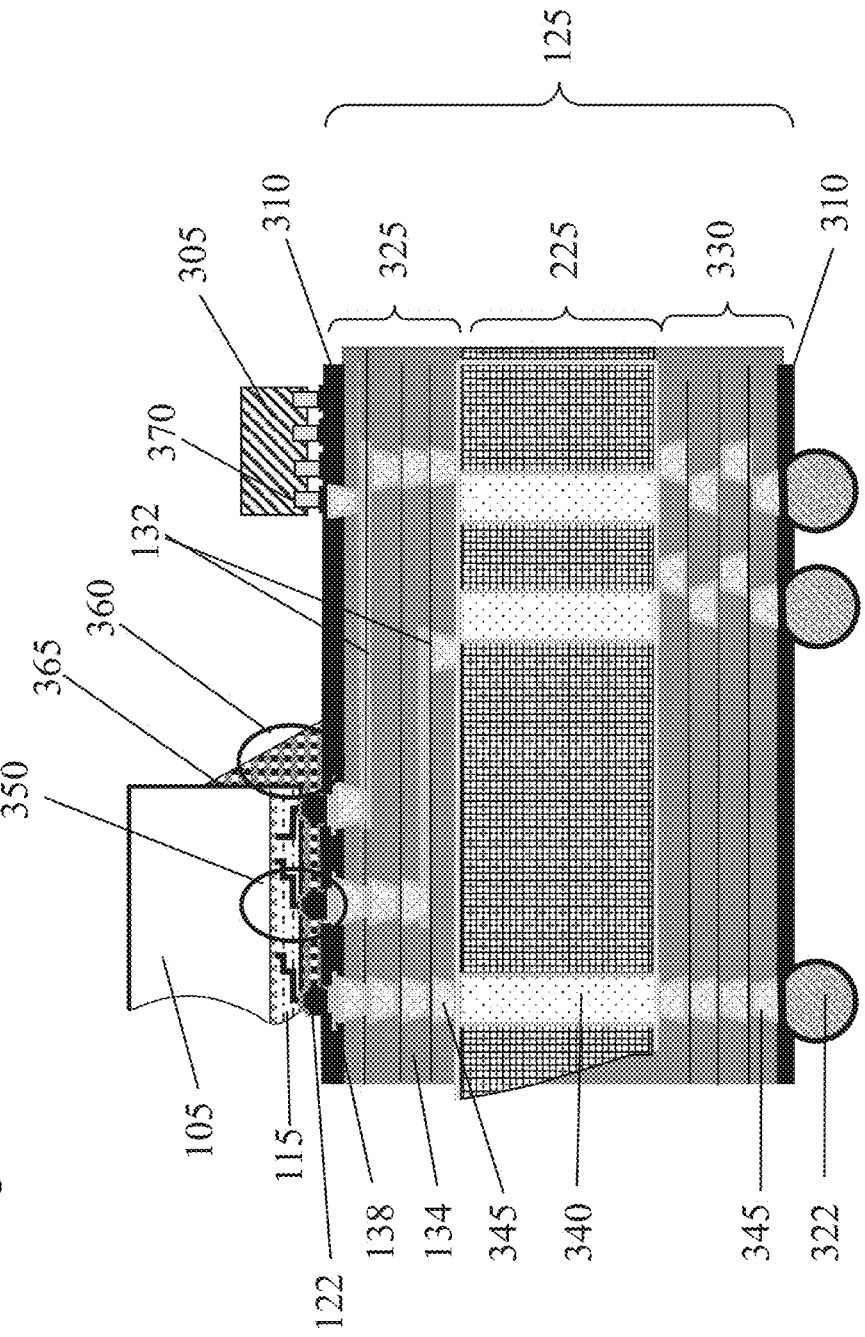
FIG. 3 is a block diagram of a substrate showing three failure modes: i. a dielectric failure in the back end of the line (BEOL) internal circuitry of a chip, ii. an underfill delamination, and iii. a Multi-Terminal Laminated Integrated Circuit (MTLIC) connection failure.

FIG. 3 is a block diagram of a package 300 showing three failure modes: i. a dielectric failure 350 in BEOL internal circuitry 115 of the connected die/chip 105, ii. an underfill delamination/fracture 360, and iii. a Multi-Terminal Laminated Integrated Circuit (MTLIC) failure 370. The three regions of the substrate 125 are shown: the Front Circuit (FC) layers 325, the core layers 225, and the Bottom Circuit (BC) layers 330.

The package 300 includes the substrate 125, a chip/die 105 with underfill 360, and a MTLIC component 305. MTLIC components include low-stress packages that perform an electrical function, e.g. a capacitance.

The dielectric failures 350 in the BEOL internal circuitry 115 of the chip/die 105 typically include fractures in the internal circuitry 115 caused by the thermal and mechanical stresses discussed above.

The stresses also cause failures in the underfill 360. Typically, underfill failures 360 are fractures in the underfill material that reduce the amount of heat transferred away from the chip/die 105 and/or cause a reduction in mechanical attachment of the chip/die 105 to the substrate 125. Often fractures in the underfill 360 are a delamination of the underfill from the substrate 125 surface.

MTLIC components 305 can be inflexible which can cause fractures where the MTLIC component 305 connects to the substrate 125. These fractures usually occur at the interface between the MTLIC leads and solder and subsequently propagate along the interface until completely debanding. The outermost located solder bumps are most susceptible to fracture in a similar way to underfill 360 failure at the chip corner (e.g. 605) where the maximum stresses occur.

FIG. 4 is a cross section elevation view of a cut away region of an organic substrate 125, shown in FIG. 1, showing the location of a dielectric failure in BEOL internal circuitry 115 of the connected die/chip 105.

FIG. 4A is a micrograph image of an example dielectric failure, e.g. circuit fracture 450, in the BEOL internal circuitry 115 of the connected die/chip 105.

To add more explanation, one or more soft zones 160 are located within and penetrate through one or more of the FC layers 325 of the substrate 125. Each soft zone 160 has a soft zone volume 460 which is made of one or more component volumes 465, the part of volume 460 located in each of one or more of the FC layers. Each soft zone component volume 465 has a soft zone cross sectional area. The soft zone cross sectional areas are located inside a chip boundary projection (e.g. 650 below) and can be measured by a width (154, 156) and/or diameter (755, below), or other like metric. The chip boundary projection, e.g. 650, is a vertical projection of one or more sides of a semiconductor chip or device through the FC layers (132, 134). For example, a device with a circular cross section would have a single side while a square chip/die 105 would have four sides.

FIG. 5A is a result of a finite element analysis (FEA) 500 of a model of internal stress and warpage undergone by the die 105 and layers of a substrate 125, e.g. the Front Circuit (FC) layers 325, that cause dielectric failures. A grey scale 510 indicates the magnitude of the internal stress at a given location 530 in the die 105 and FC layers 325.

FIG. 5B is a block diagram showing a die and substrate with the region/location 530 analyzed by the finite element analysis shown in FIG. 5A. The FEA 500 is done for the left handed side (LHS) of the FC layers 325 in region 530, i.e. the left edge of the chip/die 105 and the FC layers 325 under the vertical projection of this region of the chip/die 105.

The FEA shows that the internal stress within the chip/die 505 is in tension which increases along a path from the die bottom 510 to the top 518 of region 530. The line 550 of the FEA 500 shows the plane of least internal stress 550 in the region 530, i.e. at the interface 550 between the chip/die 105 and the top of the substrate 125 (and top of the FC layers 325).

The FEA 500 also shows that internal stress within the FC layers 325 is compressive and increases with depth into the FC layers 325, i.e. in a traverse from the interface 550 to the core 225 of the substrate 125.

This analysis was performed with a chip/die (105) 26 millimeters size and where there were solid copper planes on the FC layers 325.

FIGS. 6A, 6B, 6C, and 6D are a series of micrograph images each showing a FC layer in a substrate 125. In these non-limiting examples, the substrate 125 is a 4-2-4 laminate, i.e. the substrate has 4 FC layers 325, 2 core layers 225, and 4 Bottom Circuit (BC) layers 330.

Figure 6C:
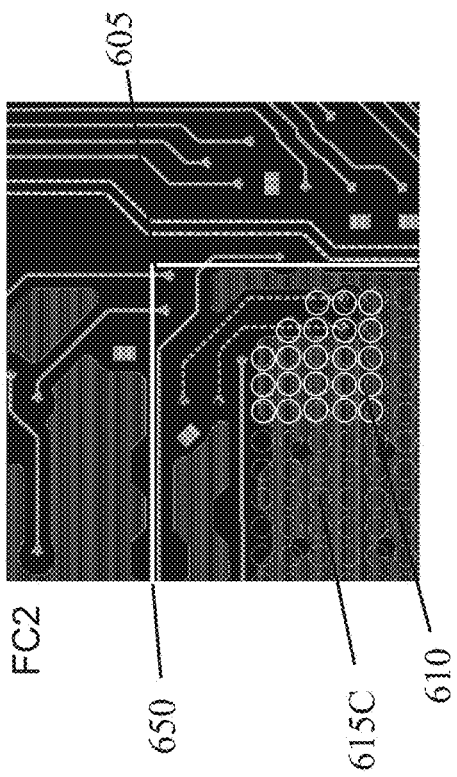
FIG. 6C is a micrograph image of a second (FC2) buildup layer in the FC of a substrate under a corner of a chip boundary vertical projection.
Figure 6D:
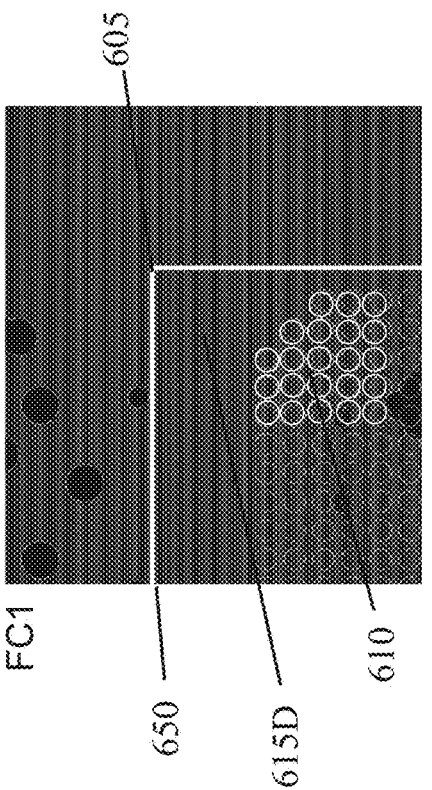
FIG. 6D is a micrograph image of a first (FC1) buildup layer in the FC of a substrate under a corner of a chip boundary vertical projection.
Figure 6A:
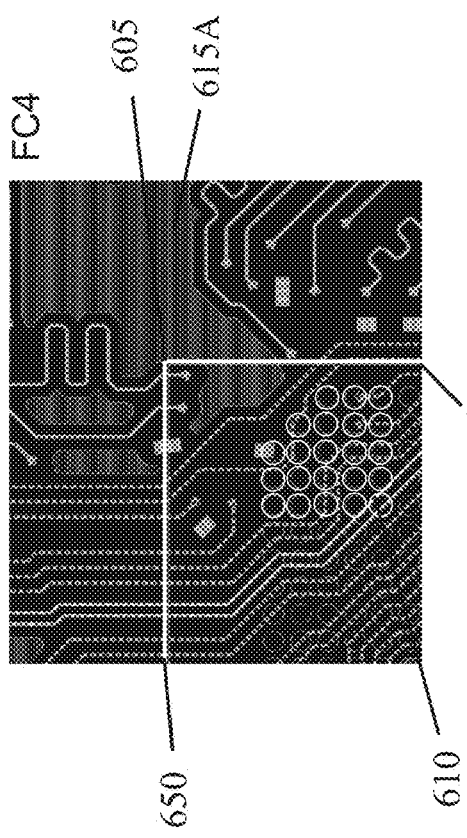
FIG. 6A is a micrograph image of a fourth (FC4) buildup layer in the Front Circuit (FC) of a substrate under a corner of a chip boundary vertical projection.

FIG. 6A is a micrograph image 600 of a fourth (FC4) buildup layer in the Front Circuit (FC) 325 of a substrate 125 under a corner 605 of a chip boundary vertical projection 650 or chip boundary projection 650.

The chip boundary projection 650 is a vertical projection of the edges of the chip/die 105 through the layers (325, 225, and 330) of the substrate 125. Part 605 of the chip boundary projection 650 is the chip corner projection 605, i.e. the projection of the chip corner 605 through the layers (325, 225, and 330) of the substrate 125.

Locations of the C4 122 connections are projected, C4 projections 610, are shown as well. Heat needed to reflow these C4 connections 122 will cause the temperatures to be highest in the C4 projection 610 locations, in this example, in proximity to the chip corner projection 605. Internal stresses on the FC4 layer 600 will be adversely affected by the large areas of solid copper, e.g. 615A, on the FC4 layer 600. The FC4 layer 600 is the layer of the substrate 125 closest to the chip/die 105.

Figure 6B:
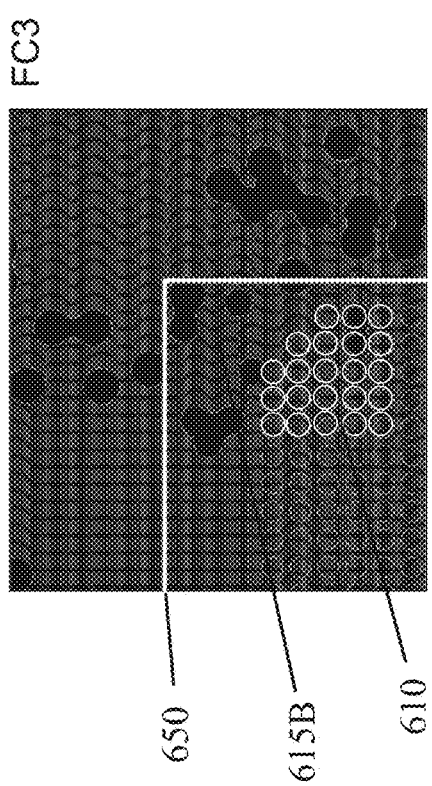
FIG. 6B is a micrograph image of a third (FC3) buildup layer in the FC of a substrate under a corner of a chip boundary vertical projection.

FIG. 6B is a micrograph image 620 of a third (FC3) buildup layer in the FC 325 of a substrate 125 under a corner 605 of a chip boundary projection 650. The FC3 layer 620 is the next layer below the chip/die 105. A large area of solid copper 615B is located on the surface of the FC3 layer 620, in a different location and with a different size than the area of solid copper 615A in the layer, FC4 above.

FIG. 6C is a micrograph image 640 of a second (FC2) buildup layer 640 in the 325 of a substrate 125 under the chip corner projection 605 of a chip boundary projection 650. In this non-limiting example, buildup layer 640 is next to lowest layer 325 and has its own area of solid copper 615C affecting the internal stresses in the substrate 125 and chip/die 105. The C4 projections are shown as well.

FIG. 6D is a micrograph image 660 of a first (FC1) buildup layer, or bottom layer 660 in this non-limiting example, in the FC 325 of a substrate 125. The C4 projections, chip boundary projection 650, and chip corner projection 605 are shown. A larger area of solid copper 615D in this layer 660 is shown in this example.

Figure 7:
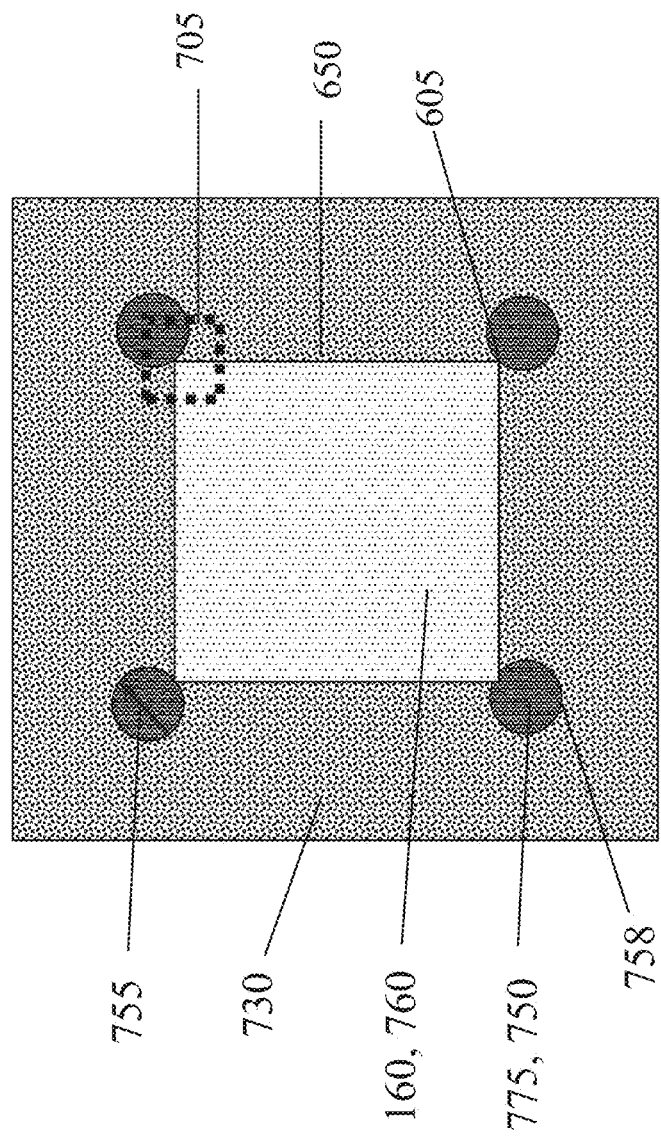
FIG. 7 is a top view block diagram of a surface of a top substrate layer also showing a. top surface of a soft zone.

FIG. 7 is a top view block diagram 700 of a surface 730 of a top substrate 125 layer 325 also showing a top surface 760 of a soft zone 160. The region 705 shows the location of the non-limiting micrograph images shown in FIGS. 6A, 6B, 6C, and 6D. In this embodiment, no material with a high Young's modulus is permitted in one or more layers 325 in the volume within the chip boundary projection 650 of the soft zone 160.

In addition, in this non-limiting example, at each of one or more of the chip corner projections 605 there are outside soft zones 775, e.g. corner soft zones, typically 750. The corner soft zones 750 are outside soft zones 775 made of materials similar to those making the soft zone 160. For example, the corner soft zones (750, 775) have no material with a high Young's modulus in one or more layers 325 of the substrate 125 in the volume within the boundary 758, e.g. edge 758, of the corner soft zone 750 projected through the substrate 125. The corner soft zones 750 typically have a cross sectional measurement 755. For example, the corner soft zones 750 can be circular cross sections 758 with a diameter 755. Other cross-sectional shapes 758 and cross-sectional measurements 755 are envisioned.

Generally, the corner soft zones 750 are used in a substrate 125 to reduce the underfill delamination problem 360. The corner soft zones 750 will be discussed in more detail below.

FIG. 8A shows a magnified finite element analysis (FEA) 800 illustration of fracture driving stress forces within a bottom chip/die 105 region near a C4 connection 122. Location 825 shows a high concentration of stress (force/aera) on a left-handed side (LHS) of a center location 807 above the center of the C4 connection 122. Location 830 shows a high concentration of stress on a right-handed side (RHS) of the center location 807. Fracture line 822 is a line connecting the LHS high stress location 825 and RHS high stress location 830 and is the line along which the chip/die 105 has a high probability of fracture.

FIG. 8B is a cross-sectional elevation view 850 of part of a substrate 125 showing the FC layers 325 including electrically conductive layers 132 (typical) and non-electrically conductive layers 134 (typical). Substrate pads 138 are included in a top layer of the FC layers 325 and are each disposed under and in electrical and physical contact with C4 contact 122 making connections to the internal chip interconnections 115 of the chip/die 105. In some embodiments, solder masks 838 electrically and physically isolate the substrate pads 138. A soft zone 160 is located within one or more of the FC layers 325 under the C4 connection 122. The soft zone 160 has a width, W, 854 that can be either constant or vary as the soft zone 160 traverses through deeper levels in the FC layers 325. There are no electrically conductive metals or other material with a higher Young's modulus within the soft zone 160.

Lines 805 and 810 are projections from the LHS high stress concentration location 825 and RHS high stress concentration 830, respectively, onto corresponding locations in the internal chip interconnections 115 layers.

Figure 9:
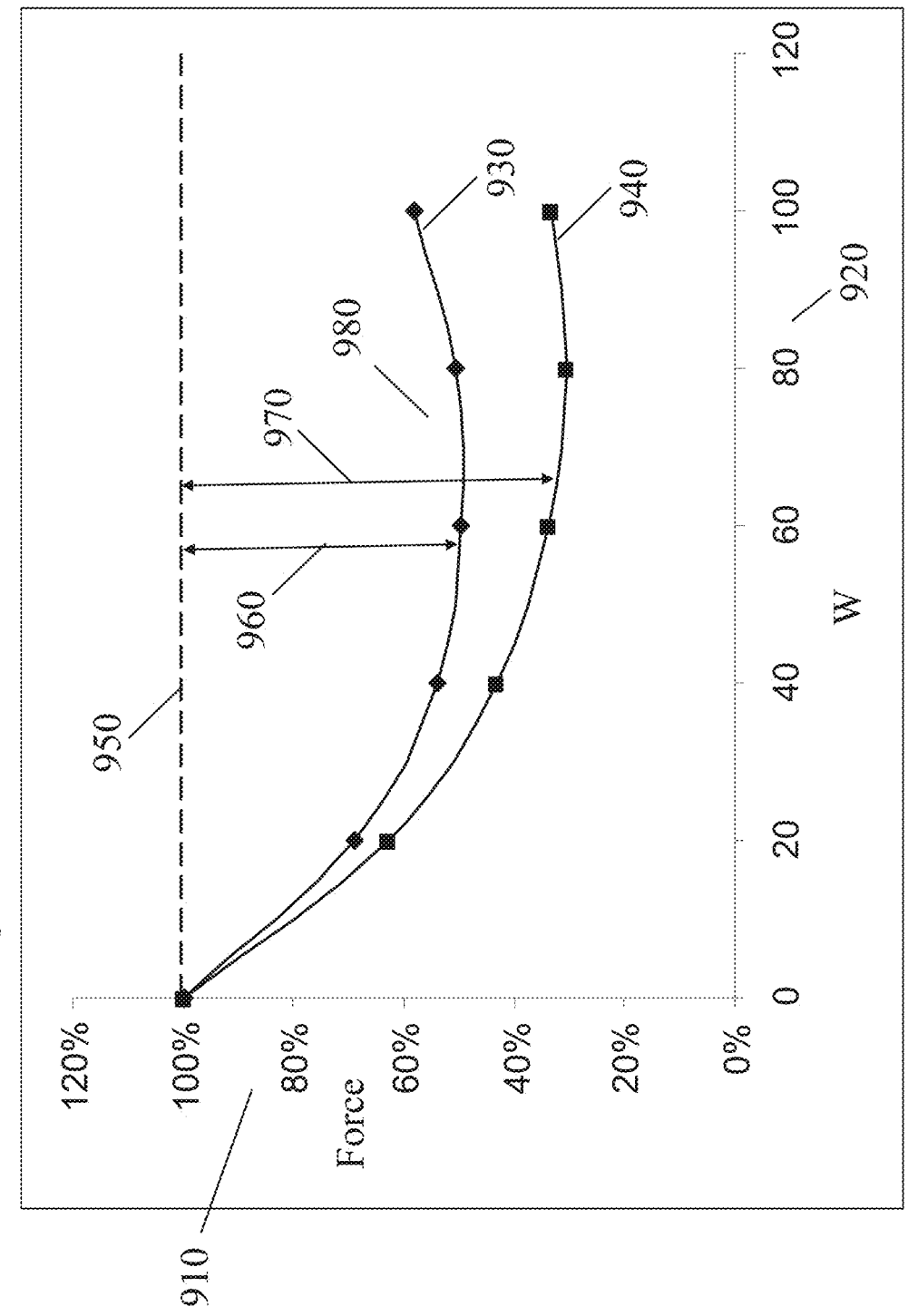
FIG. 9 is a graph of a relative fracture driving force or stress concentration at internal chip interconnection layers versus a width of a soft zone.

FIG. 9 is a graph 900 of relative fracture driving force or stress concentration at internal chip interconnection 115 layers versus width, W, 854, of a soft zone 160. The relative fracture driving force/stress, on the Y axis 910, is measured at the LHS high stress concentration location 825 and RHS high stress concentration location 830 of the internal chip interconnection 115 layer for a given C4 connection 122. In some embodiments, the force/stress is measured as a percentage of maximum force/stress 950 caused by a substrate 125 without a soft zone 160. The soft zone 160 width, W, 854, on the X axis 920, and, in some embodiments, is measured in micrometers, μm.

Curve 930 measures the LHS force/stress concentration and curve 940 measures the RHS force/stress concentration. Distance 960 is the amount of force/stress that is reduced on the LHS location 825 as a function of soft zone 160 width, W, 854, e.g. as a percentage of maximum stress experienced with no soft zone 160. Distance 970 is the amount of force/stress that is reduced on the RHS location 830 as a function of soft zone 160 width, W, 854, e.g. as a percentage of maximum stress experienced with no soft zone 160.

In this non-limiting example, the curves (930, 940) indicate that the force/stress increases as the width, W, 854 of the soft zone 160 increases over about 65 μm. However, for soft zone 160 widths, W, 854 between 0 and about 65 μm, the force/stress at both the LAS 825 and RHS 830 locations decrease as the width W 854 increases. In the range of widths, W, 854 between 55 and 65 μm, the soft zone 160 can decrease the force/stress at the LHS location 825 by more than 40% and can decrease the force/stress at the RHS location 830 by more than 60%. Measurements like this can be performed at each layer (132, 134) to determine the width (154, 156) at each given layer (132, 134).

Figure 10:
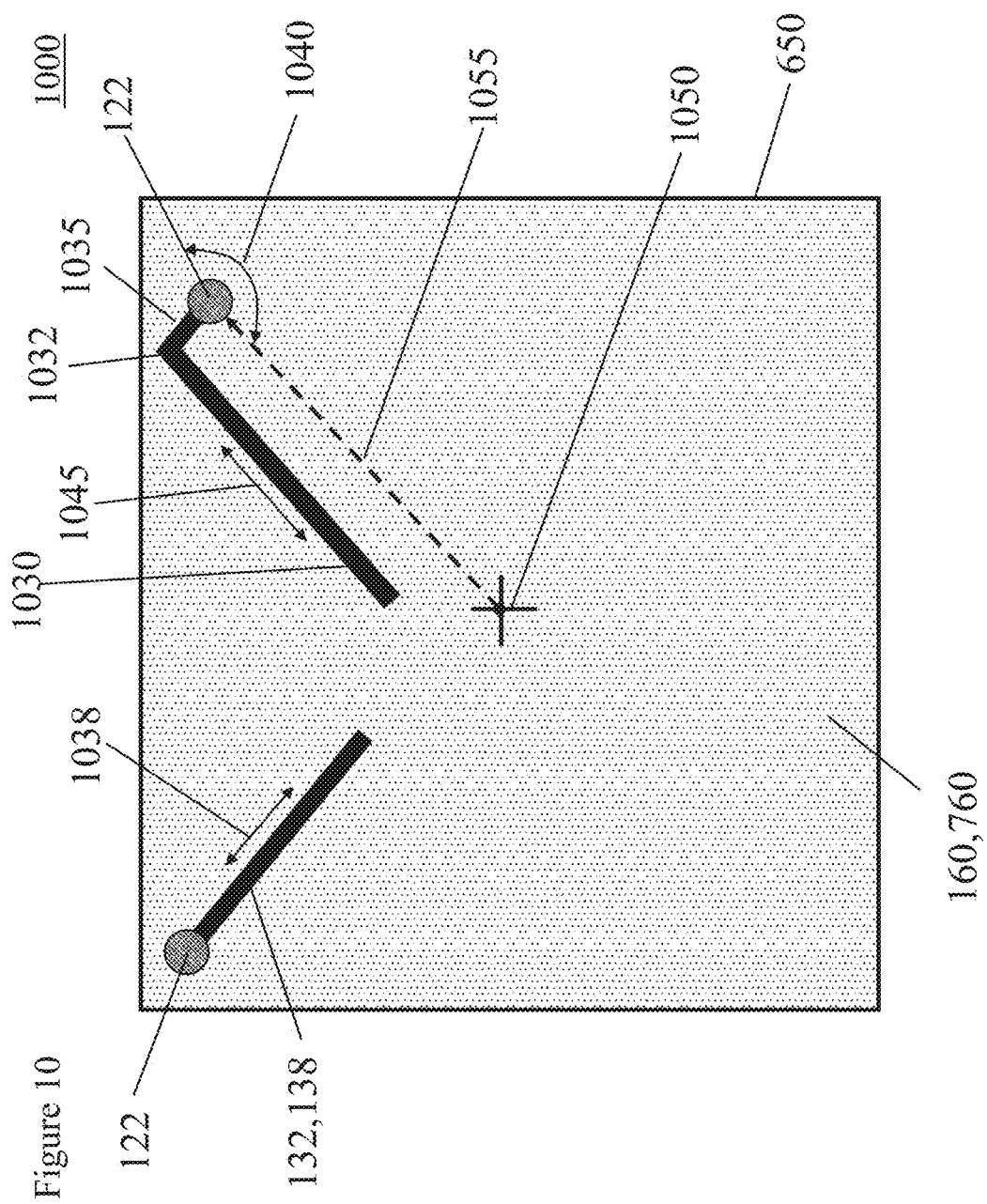
FIG. 10 is a top view of a top FC layer showing an interconnection, e.g. a substrate pad, configuration that reduces radial stiffness and dielectric failures in the BEOL internal circuitry of the connected die/chip.

FIG. 10 is a top view of a top FC layer 134 showing interconnections, e.g. substrate pad 138 configurations 1000 that reduce radial stiffness and dielectric failures in the back end of the line (BEOL) internal chip interconnection layers 115. The top FC 325 layer 132 is shown within the chip boundary projection 650. A top surface 760 of the soft zone 160 is under the top layer 132, in some embodiments.

A neutral point 1050 is a point of no stress on the FC layer 132. Transect line 1055 is a line between the neutral point 1050 and a given C4 contact 122. A stress profile can be measured along the transect line 1055. Also stresses caused by torsion can be measured along the transect line 1055, e.g. using a distance along the transect line 1055 as a moment arm.

In some embodiments, an interconnection 132 and/or a substrate pad 138 is electrically and physically attached to a C4 connection 122. The interconnection 132 and/or substrate pad 138 can be above the top surface 760 of the soft zone 160, or not. In this connection configuration, the interconnection 132/substrate pad 138 experiences a large part or all the radial stress 1038 along the axis of the interconnection 132/substrate pad 138. In addition, this radial stress 1038 is experienced at the C4 connection 122 and/or the other connected circuitry, e.g. the internal chip interconnection layers 115.

In alternative embodiments, the interconnection 132/substrate pad 138 has at least 2 legs (1030, 1035). In this connection configuration, a first connection leg 1030 is longer than a second connection leg 1035. The first connection leg 1030 can be longer than the second connection leg 1035. In some embodiments, the second connection leg 1035 connects directly to the C4 connection 122. In general, the first connection leg 1030 experiences most of the radial stress 1045. The first connection leg 1030 and the second connection leg 1035 connect at an angle 1032. As the first connection leg 1030 expands and contracts due to the radial stress 1045, the second connection leg 1035 rotates 1040 about the C4 connection 122 causing some torsional stress 1040 on the C4 interconnect 122. However, because the second connection leg 1035 is short, the torsion stress 1040 at the C4 connection 122 is small and the stress experienced by the C4 interconnect 122 and the internal chip interconnection layers 115 is reduced. In alternative embodiments, the second connection leg 1035 is connected to the opposite end of the first connection leg 1030.

Figure 11:
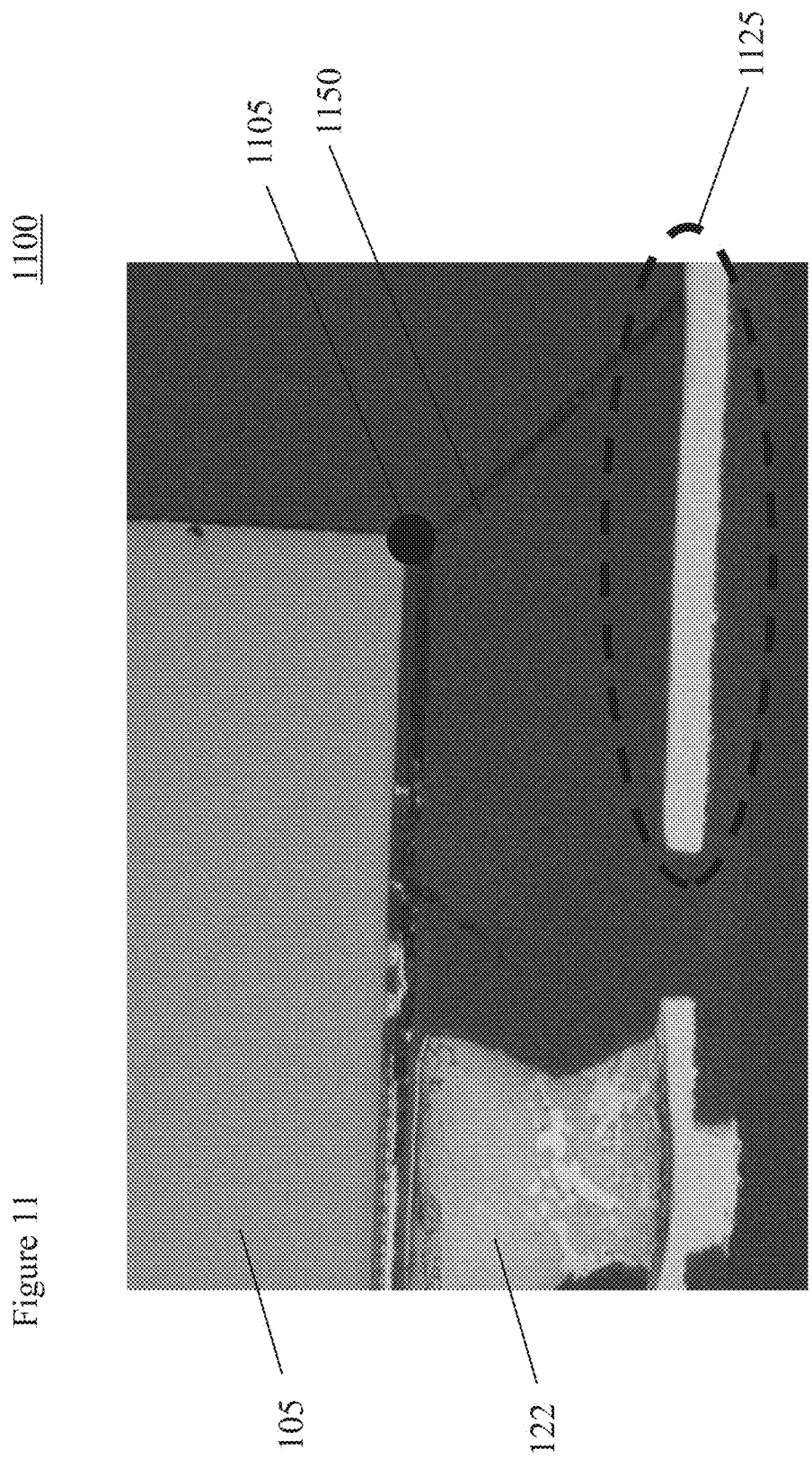
FIG. 11 is a micrograph view of a fracture of underfill, e.g. a delamination of the underfill from the surface of the organic substrate.

FIG. 11 is a micrograph view 1100 of a fracture 1125 of underfill 1150, e.g. a delamination 1125 of the underfill 1150 from the surface of the substrate 125. The chip/die 105, chip corner 1105, C4 connections 122 are shown in relation to the underfill 1150.

Figure 12:
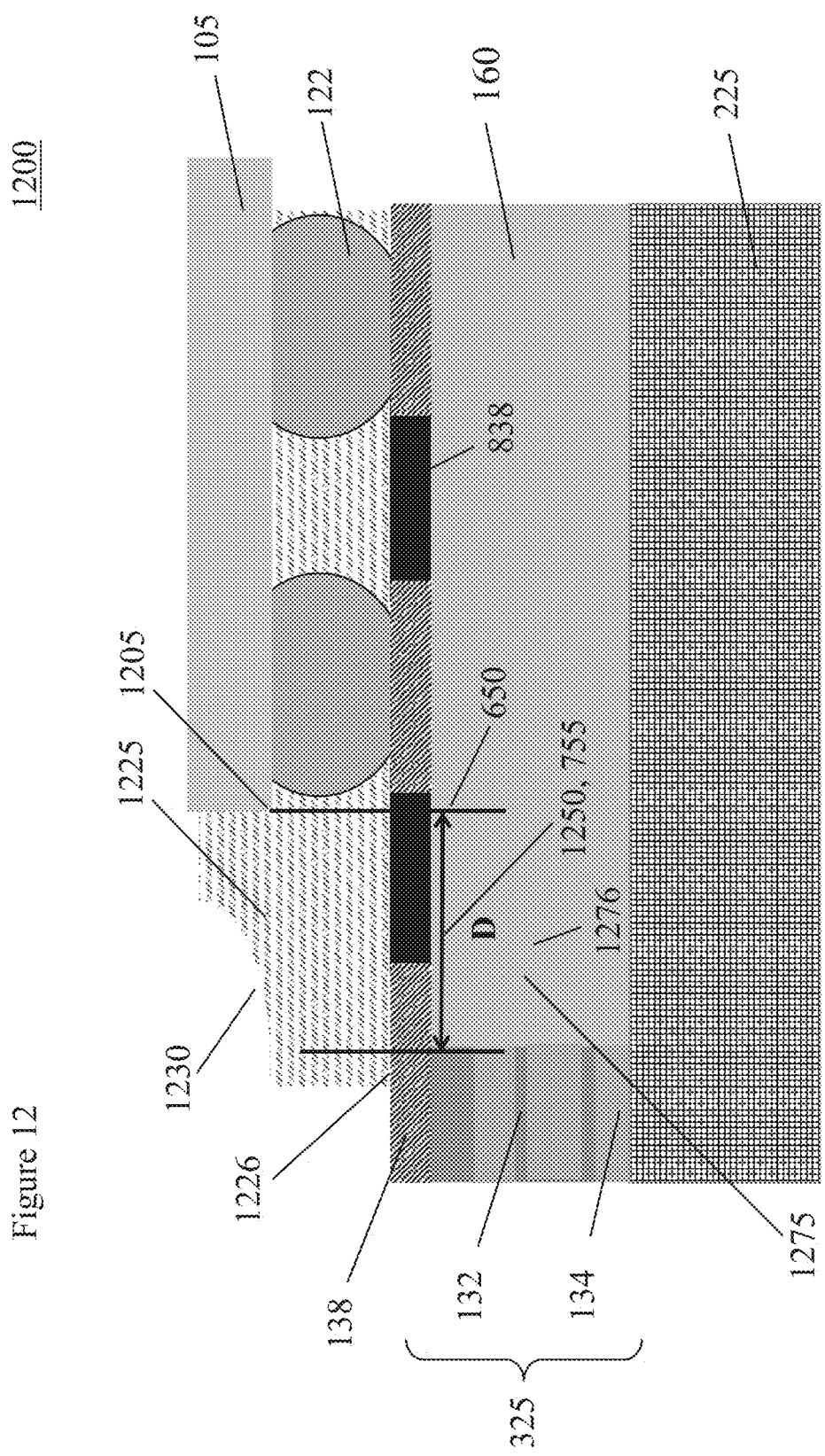
FIG. 12 is a block diagram of a cross-section elevation of chip/die connected to a substrate showing interconnection layers kept outside chip boundary projection by a distance, D, to reduce underfill delamination.

FIG. 12 is a block diagram of a cross-section elevation 1200 of a chip/die 105 connected to a substrate 125 showing interconnection layers 132 kept outside the chip boundary projection 650 by a distance, D (1250, 755) to reduce undeifill delamination 1125.

A chip/die 105 is connected to one or more C4 connections 122. One or more of the C4 connections 122 is electrically and physically attached to a substrate pad 138. One or more of the substrate pads 138 is connected to an interconnection 132. FC layers 325 include one or more resin layers 134 and substrate interconnection layers 132 that alternate, one on top of another. In some embodiments, the FC layers 325 of the substrate 125 are on a core 225 of one or more core layers. In some embodiments, the substrate pads 138 are separated by solder masks 838.

Known underfill material 1225 surrounds the sides of the chip/die 105 and fills the space between the chip/die 105 and the top surface 1226 of the substrate (125, 325) as is commonly done. The undeifill 1225 has a filet 1230 region in some embodiments.

In this embodiment, there are no substrate interconnection layers 132 permitted in one or more of the FC layers 325 in a region within D distance outside (1250, 775) the chip boundary projection 650. In some embodiments, the distance, 1250, is measured as a parallel line D distance 1250 away from one or more edges of the chip 105 projected as a chip boundary projection 650. In these non-limiting embodiments, there is an outside soft zone volume 1276 between the chip boundary projection 650 and the parallel line D distance 1250 away from one or more of the edge projections 650. No material with a high Young's modulus is permitted in the restricted volume 1275 in one or more of the FC layers 325.

In other embodiments, the distance, D, 1250 is a distance, e.g. a radial distance (1250, 755) measured from the chip boundary projection 650 of one or more corners (1205, 605) of the chip/die 105. In these embodiments, the zone 160 is a volume within the chip boundary projection 650 and there is the restricted volume 1275 is within one or more chip corners 1205 projections with a cross-section of D 755 as shown in a top view in FIG. 7. Other restricted volume 1275 shapes and locations are envisioned.

Excluding the high Young's modulus material from the outside soft zone volumes 1276 from one or more of the FC layers 325 in a region within D distance outside (1250, 775) the chip boundary projection 650 reduces stresses on the underfill 1225, including where the underfill 1225 is attached to the surface 1226 of the substrate 125.

In alternative embodiments, there are one or more outside soft zones, e.g. 1275. The outside soft zones 1275 have one or more outside soft zone volumes 1276. As before, each outside soft zone volume 1276 is located within and penetrates through one or more of the FC layers 325. The outside soft zone volumes 1276 have an outside soft zone 1275 cross sectional area. The outside soft zone cross section area can be represented (and calculated from) a metric like distance, D, 1250, 755 and can vary over the height, e.g. 152, of the outside soft zone 1275. As an example, the outside soft zone volume 1276 can be determined by integrating the product of the cross-sectional area over the height, e.g. 152, of the outside soft zone 1275. The outside soft zone volume 1276 contain the same soft zone material 150 as the soft zones 160. However, the outside soft zone volumes are located outside the chip boundary projection, e.g. 650.

Figure 13:
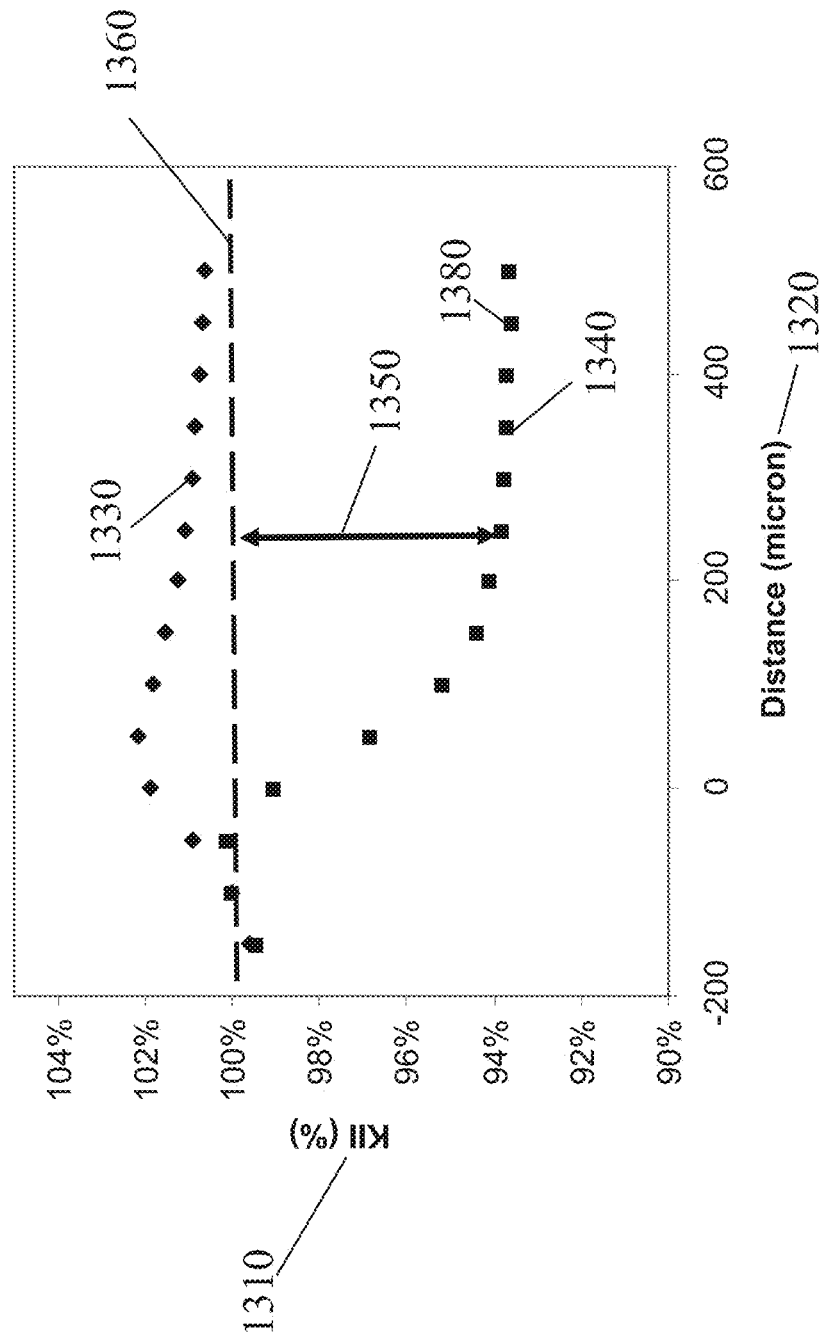
FIG. 13 is a graph of stress intensity factor versus distance outside the chip boundary projection.

FIG. 13 is a graph 1300 of stress intensity factor 1310 versus distance, D, (1250, 1320) outside (1250, 775) the chip boundary projection 650. The stress intensity factor 1310, on the Y axis 1310, is measured as a percent of stress experienced by the underfill 1225 at the projection of the chip corner 1205 if there were no restriction 1360 on substrate interconnection layers 132 in one or more of the FC layers 325 outside the chip boundary projection 650. The size of the cross-sectional area of the outside soft zone 1275 outside the chip boundary projection 650 is related to the distance, D, 1250, typically measured in microns (in micrometers, μm) on the X axis 1320.

In this non-limiting example, the substrate was a 4-2-4 layer substrate 125 with 4 FC layers 325, 2 core layers 225, and 4 BC layers 330. The FC layers 325 are 48 microns thick and the core layers 225 are 650 microns thick. The analysis is done for the top FC layer only. A similar analysis can be done for each FC layer to determine how deep into the FC layers 325 the restriction 1275 should apply.

KII is a stress intensity factor or fracture driving force. Curve 1330 measures KII-H, a stress intensity factor or fracture driving force in a horizontal direction toward the center of the chip/die 105 along the interface between the chip bottom face and the underfill 1150. Curve 1340 measures KII-V, a fracture driving force in a vertical direction toward the top of the chip/die 105 along the chip/die 105 side wall. Both KII-H and KII-V are responsible for chip corner 605 fracture and underfill 1150 fracture 1125.

The distance 1350 shows about a 6% improvement of 1340 with a distance, D, 1250 of about 225 microns after which the improvement "flattens out" 1380 with increased size of the restricted region 1275.

Figure 14:
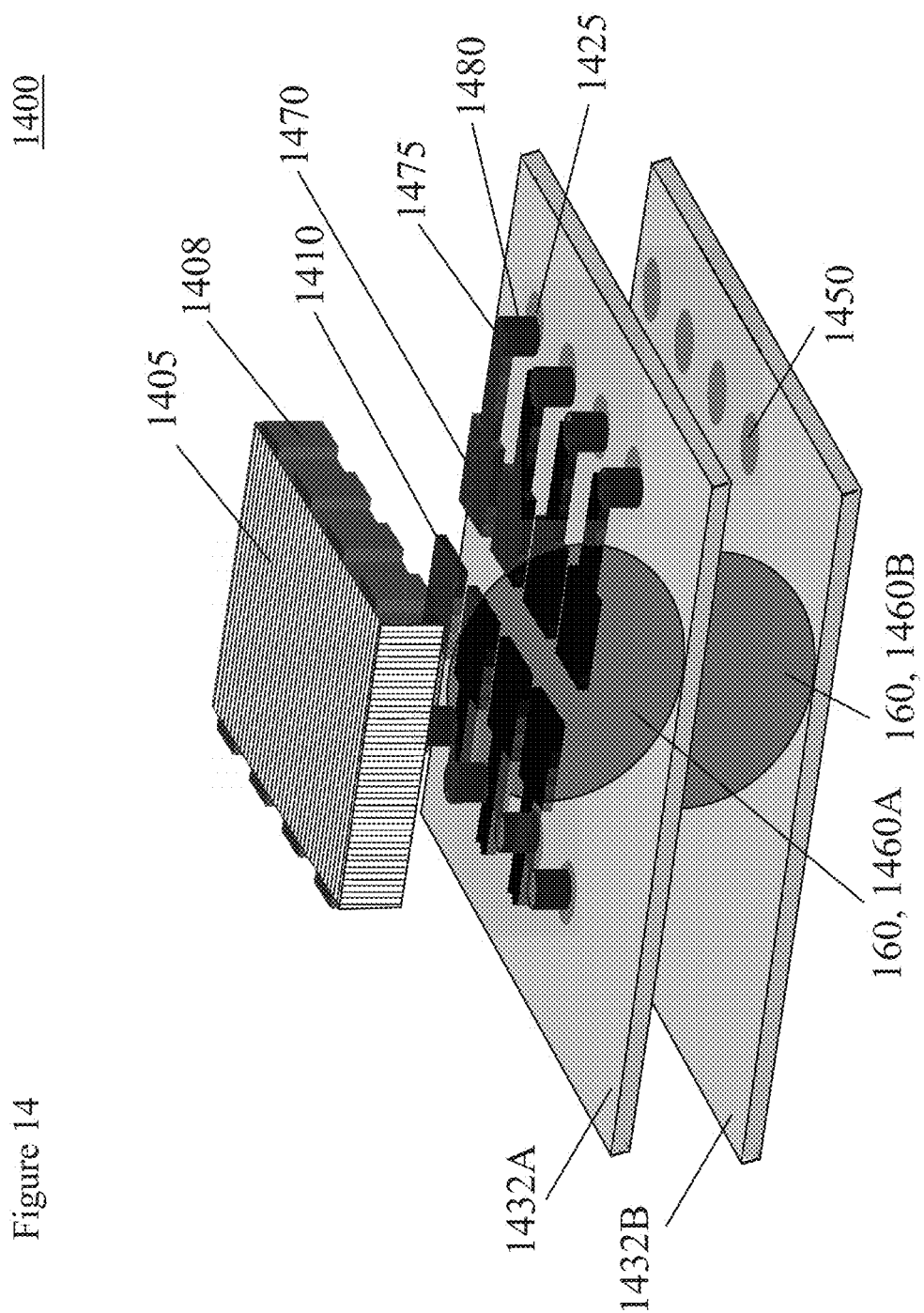
FIG. 14 is a block diagram showing a Multi-Terminal Laminated Integrated Circuit (MTLIC) attached to a substrate with cantilevered connections.

FIG. 14 is a block diagram 1400 showing a Multi-Terminal Laminated Integrated Circuit (MTLIC) (1405, 305) attached to a substrate 125 with cantilevered connections 1410.

MTLIC 1405 can be inflexible/inelastic and as a result can cause stress where MTLIC contacts 1408 connect to the substrate 125.

In some embodiments, cantilevered connections 1410 are interposed between the MTLIC contacts 1408 to reduce this stress. The cantilevered connection 1410 has a first cantilever arm 1470 connected at and angle 1475 to a second cantilever arm 1480. One or more of the first cantilever arms 1470 is electrically and physically connected to a corresponding MTLIC contact 1408. The second cantilever arm 1480 is connected to a corresponding connection on the substrate, e.g. a substrate pad 138 and/or connection 1425. For example, connections 1425 to the second cantilever are 1480 can be made to a FC 325 layer 132 that is a ground plane 1432A or to a FC 325 layer 132 that is a voltage plane 1432B.

Stresses that are imposed on/by the MILIC 1405 are taken up by the cantilever connections 1410 bending to reduce the stress experienced by the MTLIC 1405, internal circuitry within the MTLIC 1405, and the substrate layers (e.g. 132, 1432A, 1432).

In addition, soft zones 160 can be located 190 in one or more of these layers (1432A, 1432B), Soft zones (160, 1460A, 1460B) can be located 190 in one or more layers (132, 1432A, 1432B) within the area defined by the projection of the edges of the MILIC through the layers (e.g. 1432A, 1432B). In addition, restricted regions (1275, 1450) can be located one or more of the layers (132, 1432A, 11.432B) below and within an area defined by the projection of the cross-section (1450, 750, 758) of the connection 1425 to the cantilever 1410.

Figure 15:
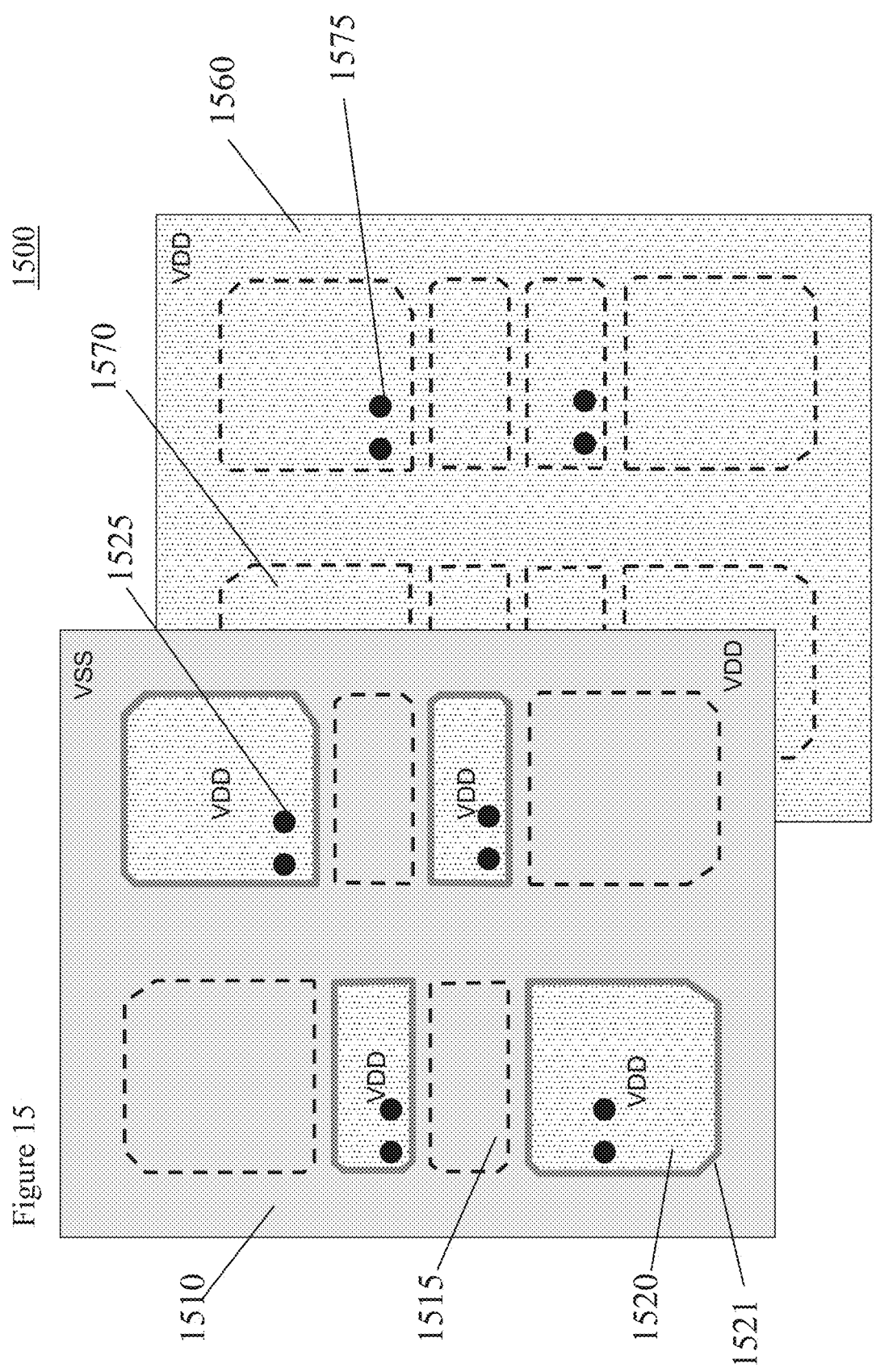
FIG. 15 shows two metal layers of an organic substrate.

FIG. 15 shows two metal layers (1510, 1560) of an organic substrate 1500. Top layer 1510 shows ground plane (VSS) 1510 and next layer 1560 shows the next voltage plane (VDI)) 1560. Four pads 1520, typically, on top layer 1510 provide voltage VDD to a MTLIC 1405 and the remaining 4 pads (dashed lines, typically 1515) provide ground, i.e., ground pads 1515. Top VDD voltage pads 1520 are electrically linked to next layer VDD 1560 through vias. shown as a pair of dots (1525, 1575).

In this embodiment a MTLIC 1405 is integrated with an organic laminate using selected ground pads 1515 (typically) that are part of a ground plane 1510 and remaining voltage pads 1520 (typically) that are connected to supply voltage VDD plane 1560 through vias 1525 and 1575. Voltage pads 1520 are electrically isolated from ground plane 1510 by insulating material 1521. Regions 1570 on voltage plane 1560 are shadows of the ground pad 1510 isolation material 1521. Any in-plane motion of ground pads 1515 is severely constrained simply because they are an extension of a large plane 1510. Furthermore, the in-plane motion of the VDD pads 1520 are moderately constrained by the vias (1525, 1575).

Figure 16:
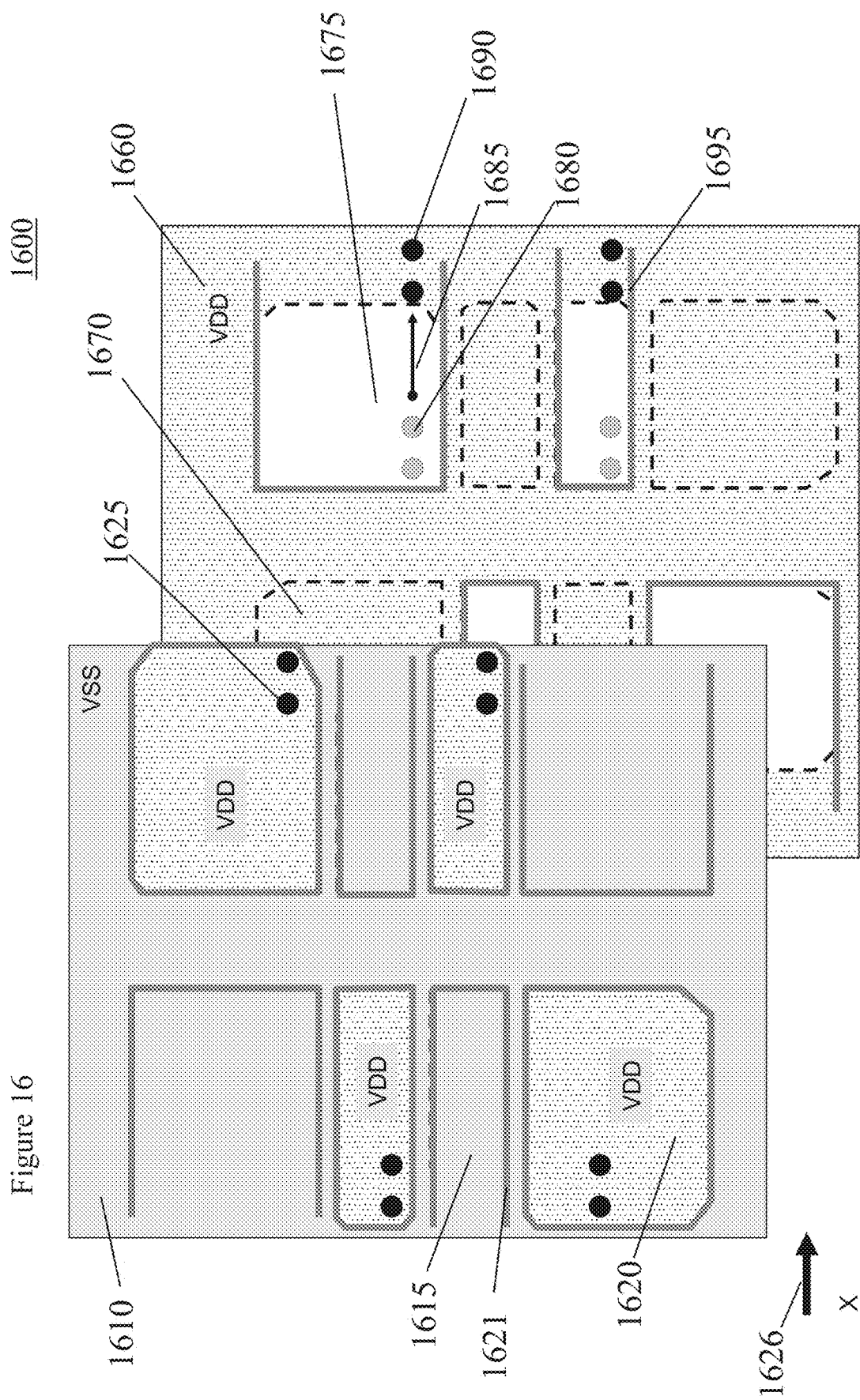
FIG. 16 shows a modified top and next layer of an organic substrate described by FIG. 15.

FIG. 16 shows a modified top and next layer (1610, 1660) of an organic substrate 1600 described by FIG. 15. The voltage pads VDD (1625, typically) have been elongated in X-direction 1626 and the via connections (1625, 1680) are moved 1685 further out, e.g. 1690, to allow freedom of movement for the VDD voltage pads 1620. The ground pads 1615 VSS have slots 1621 around three sides to provide freedom of movement while electrically linked to VSS (top) plane. Similarly, slot 1695 is introduced to provide flexibility for in-plane motion within voltage plane 1660. Motivation to mechanically isolate the regions in the vicinity of MTLIC pads is to provide softer zones or reduced in-plane stiffness which would reduce the stress encountered by a MTLIC 1405.

Figure 17:
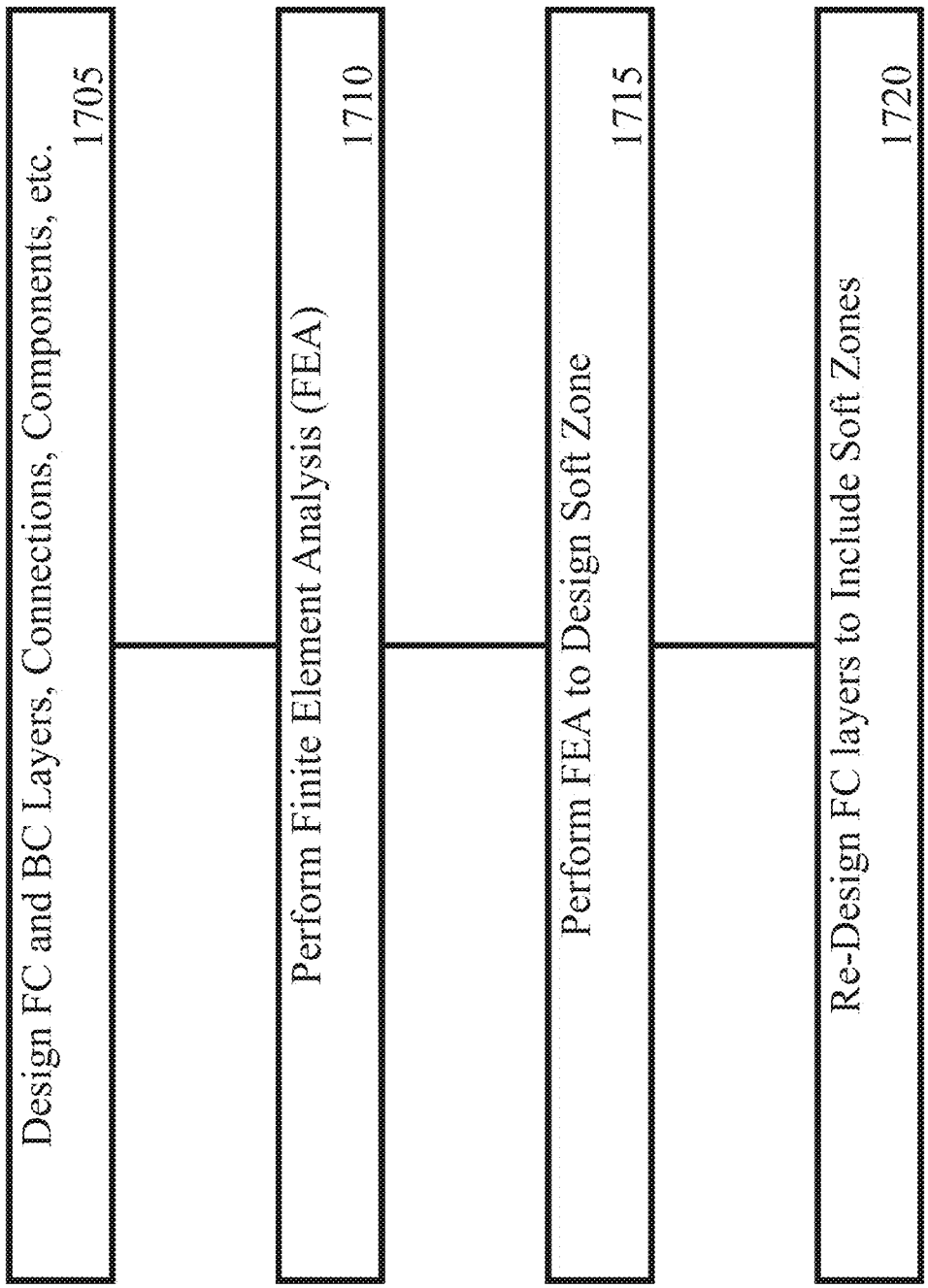
FIG. 17 is a flow chart of a method of making an organic substrate with one or more soft zones.

FIG. 17 is a flow chart of a method 1700 of making an organic substrate with one or more soft zones 160.

The method 1700 begins with step 1705, by designing one or more Front Circuit (FC) layers and one or more Bottom Circuit (BC) layers to determine composition and location of one or more materials in the FC and BC layers, locations and materials for one or more devices attached to the substrate, and locations and materials for one or more connections connecting the one or more of the devices to the substrate. This step is performed by known methods.

In step 1710, a finite element analysis (FEA) is performed to determine stresses at one or more locations in the substrate during one or more thermal and mechanical cycles.

In step 1715 a FEA is performed again to iteratively determine the position, shape, and size of one or more soft zones 160. The soft zone 160 size, volume, cross-sectional area, widths, radius, height, location, etc. are iteratively determined to achieve an optimal stress and warp at locations throughout the substrate 125 and components, chip/dies 105. MTLIC's etc.

In step 1720 the FC layers 325 are re-designed so that no material with a Young's modulus greater than 100 G Pa is located within the soft zone 160.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc. Systems and hardware incorporating the semiconductor devices are contemplated embodiments of the invention.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, strictures, techniques, and methods described with different terminology that perform substantially the same function, work in the substantial the same way, have substantially the same use, and/or perform the similar steps are contemplated as embodiments of this invention.

We claim:
1. An organic substrate comprising:
   one or more bottom circuit (BC) layers disposed one upon another;
   one or more front circuit (FC) layers disposed one upon another, the FC layers disposed on the BC layers; and
   one or more soft zones, the soft zones being one or more soft zone volumes each located within and penetrating through one or more of the FC layers, in each of one or more of the FC layers the soft zone volume having a soft zone cross sectional area and the soft zone volume containing a soft zone material, the soft zone cross sectional area being located inside a device boundary projection, the device boundary projection being a vertical projection of one or more sides of a device through the FC layers, wherein the soft zone material has a Young's modulus below 100 GigaPascals (GPa).

2. A substrate, as in claim 1, where the device includes one or more of the following: a semiconductor chip, a Multi-Layer Laminated Integrated Circuit (MILIC), a component, a connection, a C4 connection.

3. A substrate, as in claim 1, where the soft zone material has a Young's modulus below 25 GPa.

4. A substrate, as in claim 1, where the soft zone cross sectional area has a width and the width is different in one or more of the FC layers.

5. A substrate, as in claim 4, where the width in a lower FC layer is less than the width in a high FC layer.

6. A substrate, as in claim 1, further comprising one or more core layers, the core layers being the FC layers and the BC layers, where a soft zone height extends from a surface of the substrate to a top core layer.

7. A substrate, as in claim 1, where the soft zone does not penetrate through all the FC layers.

8. A substrate, as in claim 1, where the soft zone material is an electrically insulating, low k material.

9. A substrate, as in claim 8, where the soft zone material includes one or more of the following: a resin, an epoxy, an epoxy resin, a glass epoxy, and FR-4.

10. A substrate, as in claim 1, where the device is a Multi-Layer Laminated Integrated Circuit (MILIC) with one or more cantilevered connections connecting the MILIC to substrate MILIC connections on the substrate, the substrate further comprising an outside soft zones, the outside soft zones being one or more outside soft zone volumes, each outside soft zone volume located within and penetrating through one or more of the FC layers and outside the chip boundary projection and under one of the MILIC connections.

11. A substrate, as in claim 10, further having a soft zone under the MILIC.

12. An organic substrate comprising:
one or more bottom circuit (BC) layers disposed one upon another;
one or more front circuit (FC) layers disposed one upon another, the FC layers disposed on the BC layer;
one or more soft zones, the soft zones being one or more soft zone volumes each located within and penetrating through one or more of the FC layers, in each of one or more of the FC layers the soft zone volume having a soft zone cross sectional area and the soft zone volume containing a soft zone material, the soft zone cross sectional area being located inside a chip boundary projection, the chip boundary projection being a vertical projection of one or more sides of a semiconductor chip through the FC layers; and
one or more outside soft zones, the outside soft zones being one or more outside soft zone volumes, each outside soft zone volume located within and penetrating through one or more of the FC layers, the outside soft zone volume having an outside soft zone cross sectional area and the outside soft zone volume containing the soft zone material, the outside soft zone volumes located outside the chip boundary projection,
wherein the soft zone material has a Young's modulus less than 50 GigaPascals (G-Pa).

13. A substrate, as in claim 12, where one or more of the outside soft zones is along a projection of the chip boundary projection with the outside soft zone cross sectional area having a width.

14. A substrate, as in claim 12 where one or more of the outside soft zones is located adjacent to a corner of the chip boundary projection and where the outside soft zone cross section area has a radius.

15. A substrate, as in claim 12, further comprising:
one or more chips;
one or more chip connections connected to one or more chip internal circuitry; and
one or more substrate pads,
where soil zone is under one or more of the C4 connections.

16. A substrate, as in claim 12, where the soft zone has a shape of a truncated pyramid or cone.

17. A substrate, as in claim 12, where the substrate pads further comprises:
a first connection leg;
a second connection leg, the first connection leg being longer than the second connection leg, the first connection leg and the second connection leg connected at an angle, the first connection leg connected to one of the chip connections and the second leg connected to one of the substrate,
wherein stress experienced in the substrate pad causes a torsion about the chip connection.

18. A substrate, as in claim 17, where the stress is experienced in the first connection leg on a radius from a neutral point.

19. A substrate, as in claim 12, where one or more of the FC layers is a ground plane and one or more of the FC layers is a voltage plane.

20. An organic substrate comprising:
one or more bottom circuit (BC) layers disposed one upon another;
one or more front circuit (FC) layers disposed one upon another, the FC layers disposed on the BC layer;
one or more soft zones, the soft zones being one or more soft zone volumes each located within and penetrating through one or more of the FC layers, in each of one or more of the FC layers the soft zone volume having a soft zone cross sectional area and the soft zone volume containing a soft zone material, the soft zone cross sectional area being located inside a chip boundary projection, the chip boundary projection being a vertical projection of one or more sides of a semiconductor chip through the FC layers; and
one or more outside soft zones, the outside soft zones being one or more outside soft zone volumes, each outside soft zone volume located within and penetrating through one or more of the FC layers, the outside soft zone volume having an outside soft zone cross sectional area and the outside soft zone volume containing the soft zone material, the outside soft zone volumes located outside the chip boundary projection,
wherein the soft zone material has a Young's modulus less than 100 GigaPascals (Glia) and
wherein the soft zone material excludes any of one or more of the following: metal contacts, metal planes, metal interconnections, and metal lines.

21. The organic substrate, as in claim 20, where one or more of the soft zones or one or more of the outside soft zones is located at a high stress location of the organic substrate.

22. The organic substrate, as in claim 21, where the high stress locations include one or more of the following: a fracture line, a volume within a vertical projection of one or more edges or corners of a chip, volumes of one or more layers under a chip that experience temperature cycling, regions that experience mechanical stresses, strains, and warping due to drilling, ablating, polishing, and compressing, and regions that undergo solder reflow.

* * * * *